(12) United States Patent
Ishida

(10) Patent No.: US 12,382,225 B2
(45) Date of Patent: Aug. 5, 2025

(54) ELECTROACOUSTIC CONVERSION FILM AND ELECTROACOUSTIC CONVERTER

(71) Applicant: FUJIFILM Corporation, Tokyo (JP)

(72) Inventor: Jumpei Ishida, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 903 days.

(21) Appl. No.: 17/547,187

(22) Filed: Dec. 9, 2021

(65) Prior Publication Data

US 2022/0103949 A1 Mar. 31, 2022

Related U.S. Application Data

(63) Continuation of application No. PCT/JP2020/022465, filed on Jun. 8, 2020.

(30) Foreign Application Priority Data

Jun. 28, 2019 (JP) .................. 2019-121097

(51) Int. Cl.
*H04R 17/00* (2006.01)
*H10N 30/85* (2023.01)
*H10N 30/88* (2023.01)

(52) U.S. Cl.
CPC ......... *H04R 17/005* (2013.01); *H10N 30/852* (2023.02); *H10N 30/883* (2023.02)

(58) Field of Classification Search
CPC .... G10H 3/14; G10H 3/143; G10H 2220/555; G10H 2220/551; G10H 2220/535; G10H 2220/541; H04R 31/003; H04R 17/005; H04R 17/02; H04R 2307/023; H04R 1/46;

(Continued)

(56) References Cited

U.S. PATENT DOCUMENTS

| 9,621,997 B2 | 4/2017 | Miyoshi et al. |
| 9,761,784 B2 | 9/2017 | Miyoshi |
| 11,549,035 B2 * | 1/2023 | Adamchuk ............. B32B 27/20 |

(Continued)

FOREIGN PATENT DOCUMENTS

| CN | 102347708 | 2/2012 |
| CN | 103843365 | 6/2014 |

(Continued)

OTHER PUBLICATIONS

"Office Action of Taiwan Counterpart Application", issued on Apr. 9, 2024, with English translation thereof, pp. 1-13.

(Continued)

*Primary Examiner* — J. San Martin
(74) *Attorney, Agent, or Firm* — JCIPRNET

(57) ABSTRACT

Provided are an electroacoustic conversion film and an electroacoustic converter which are capable of suppressing a decrease in piezoelectric conversion efficiency in a case of use in a high-temperature environment. The electroacoustic conversion film is an electroacoustic conversion film including a polymer-based piezoelectric composite material which contains piezoelectric particles in a matrix containing a polymer material, and electrode layers which are formed on both surfaces of the polymer-based piezoelectric composite material, in which the electroacoustic conversion film has a thermal expansion coefficient of 12 ppm/° C. to 100 ppm/° C.

20 Claims, 3 Drawing Sheets

(58) Field of Classification Search
CPC .............................. H04R 7/10; H04R 2499/15; H04R 2307/025; H10N 30/045; H10N 30/883
See application file for complete search history.

(56) References Cited

U.S. PATENT DOCUMENTS

| | | | |
|---|---|---|---|
| 2007/0159028 A1 | 7/2007 | Nagaya et al. | |
| 2007/0247028 A1 | 10/2007 | Brosch et al. | |
| 2012/0026103 A1 | 2/2012 | Woo et al. | |
| 2014/0210309 A1* | 7/2014 | Miyoshi | G10H 3/146 310/313 A |
| 2017/0018700 A1 | 1/2017 | Miyoshi et al. | |
| 2018/0160248 A1* | 6/2018 | Murakami | G10H 3/14 |
| 2021/0392453 A1 | 12/2021 | Murakami et al. | |

FOREIGN PATENT DOCUMENTS

| | | |
|---|---|---|
| JP | S5380437 | 7/1978 |
| JP | H0520630 | 3/1993 |
| JP | H1154531 | 2/1999 |
| JP | 2006108639 | 4/2006 |
| JP | 2008294493 | 12/2008 |
| JP | 2011166365 | 8/2011 |
| JP | 2014014063 | 1/2014 |
| JP | 2014212307 | 11/2014 |
| KR | 20030019679 | 3/2003 |
| TW | 200621858 | 7/2006 |
| WO | 2006030942 | 3/2006 |
| WO | 2017018313 | 2/2017 |

OTHER PUBLICATIONS

"International Search Report (Form PCT/ISA/210) of PCT/JP2020/022465," mailed on Aug. 18, 2020, with English translation thereof, pp. 1-5.
"Written Opinion of the International Searching Authority (Form PCT/ISA/237)" of PCT/JP2020/022465, mailed on Aug. 18, 2020, with English translation thereof, pp. 1-6.
Office Action of Japan Counterpart Application, with English translation thereof, issued on Oct. 25, 2022, pp. 1-8.
"Office Action of Korea Counterpart Application", issued on Jan. 11, 2024, with English translation thereof, pp. 1-10.
R.K. Goyal et al., "Dielectric, mechanical and thermal properties of polymer/BaTiO3 composites for embedded capacitor", Composites Part B, Jun. 28, 2012, pp. 1-5, vol. 44, Issue 1.
"Search Report of Europe Counterpart Application", issued on May 8, 2023, p. 1-p. 9.
"Office Action of Korea Counterpart Application", issued on Jul. 20, 2023, with English translation thereof, pp. 1-13.
"Office Action of China Counterpart Application", with English translation thereof, issued on May 6, 2025, pp. 1-17.

* cited by examiner

ELECTROACOUSTIC CONVERSION FILM AND ELECTROACOUSTIC CONVERTER

CROSS-REFERENCE TO RELATED APPLICATIONS

This application is a Continuation of PCT International Application No. PCT/JP2020/022465 filed on Jun. 8, 2020, which claims priority under 35 U.S.C. § 119(a) to Japanese Patent Application No. 2019-121097 filed on Jun. 28, 2019. The above application is hereby expressly incorporated by reference, in its entirety, into the present application.

BACKGROUND OF THE INVENTION

1. Field of the Invention

The present invention relates to an electroacoustic conversion film and an electroacoustic converter.

2. Description of the Related Art

With reduction in thickness of displays such as liquid crystal displays or organic EL displays, speakers used in these thin displays are also required to be lighter and thinner. Further, in flexible displays having flexibility, speakers are also required to have flexibility in order to be integrated with flexible displays without impairing lightness and flexibility. As such lightweight, thin, and flexible speakers, it is considered to adopt sheet-like electroacoustic conversion films having a property of stretching and contracting in response to an applied voltage.

It has been suggested to use a piezoelectric composite material containing piezoelectric particles in a matrix as such a sheet-like electroacoustic conversion film having flexibility.

For example, JP2014-014063A describes an electroacoustic conversion film including a polymer-based piezoelectric composite material obtained by dispersing piezoelectric particles in a viscoelastic matrix formed of a polymer material having viscoelasticity at room temperature, thin film electrodes formed on both surfaces of the polymer-based piezoelectric composite material, and a protective layer formed on a surface of the thin film electrode.

It is also considered that a speaker having flexibility is obtained by attaching an exciter having flexibility to a vibration plate having flexibility. An exciter is an exciton that vibrates an article and produces a sound by being brought into contact with various articles and being attached thereto.

For example, JP2008-294493A describes a flexible display obtained by integrating a display having flexibility such as an organic electroluminescence display and a speaker having flexibility which is formed by interposing a piezoelectric film such as polyvinylidene fluoride (PVDF) between electrodes. The speaker having flexibility can be positioned as an exciter type speaker that outputs a sound using PVDF as an exciton and a display as a vibration plate.

SUMMARY OF THE INVENTION

Here, based on the examination conducted by the present inventors, it was found that in a case where an electroacoustic conversion film obtained by using a polymer-based piezoelectric composite material containing piezoelectric particles in a matrix is used as a speaker and is used in a high-temperature environment, the distance between piezoelectric particles is widened due to the thermal expansion of the polymer in the polymer-based piezoelectric composite material so that deformation of the piezoelectric particles is unlikely to be transmitted into the polymer-based piezoelectric composite material, and thus a problem of a decrease in sound pressure occurs.

Further, in a case where an exciter is bonded to a vibration plate having a flexibility to obtain a speaker having flexibility, an electroacoustic conversion film having a polymer-based piezoelectric composite material that contains piezoelectric particles in a matrix containing a polymer material is considered to be used as the exciter. However, it was found that in a case where the electroacoustic conversion film is used in a high-temperature environment even in this case, the distance between the piezoelectric particles is widened due to the thermal expansion of the polymer in the polymer-based piezoelectric composite material so that deformation of the piezoelectric particles is unlikely to be transmitted into the polymer-based piezoelectric composite material, and thus a problem of a decrease in sound pressure occurs.

The present invention has been made to solve such problems of the related art, and an object thereof is to provide an electroacoustic conversion film and an electroacoustic converter which are capable of suppressing a decrease in piezoelectric conversion efficiency in a case of use in a high-temperature environment.

In order to achieve the above-described object, the present invention has the following configurations.

[1] An electroacoustic conversion film comprising: a polymer-based piezoelectric composite material which contains piezoelectric particles in a matrix containing a polymer material; and electrode layers which are formed on both surfaces of the polymer-based piezoelectric composite material, in which the electroacoustic conversion film has a thermal expansion coefficient of 12 ppm/° C. to 100 ppm/° C.

[2] The electroacoustic conversion film according to [1], further comprising: a protective layer laminated on a surface of the electrode layer on a side opposite to a surface provided with the polymer-based piezoelectric composite material.

[3] The electroacoustic conversion film according to [1] or [2], in which the polymer-based piezoelectric composite material is polarized in a thickness direction.

[4] The electroacoustic conversion film according to any one of [1] to [3], in which the polymer-based piezoelectric composite material does not have in-plane anisotropy as a piezoelectric characteristic.

[5] The electroacoustic conversion film according to any one of [1] to [4], in which the polymer material has viscoelasticity at room temperature.

[6] An electroacoustic converter comprising: an electroacoustic conversion film which includes a polymer-based piezoelectric composite material containing piezoelectric particles in a matrix containing a polymer material and electrode layers which are formed on both surfaces of the polymer-based piezoelectric composite material; and a vibration plate which is laminated on the electroacoustic conversion film, in which the electroacoustic converter has a thermal expansion coefficient of 12 ppm/° C. to 100 ppm/° C.

[7] The electroacoustic converter according to [6], in which an absolute value of a difference between a thermal expansion coefficient of the electroacoustic conversion film and a thermal expansion coefficient of the vibration plate is in a range of 0 ppm/° C. to 80 ppm/° C.

[8] The electroacoustic converter according to [6] or [7], in which the electroacoustic conversion film has a thermal expansion coefficient of 12 ppm/° C. to 100 ppm/° C.

[9] The electroacoustic converter according to any one of [6] to [8], in which a loss tangent (Tan δ) of the electroacoustic conversion film at a frequency of 1 Hz and 60° C. according to dynamic viscoelasticity measurement is 0.03 or greater.

[10] The electroacoustic converter according to any one of [6] to [9], in which the electroacoustic conversion film includes a protective layer laminated on a surface of the electrode layer on a side opposite to a surface provided with the polymer-based piezoelectric composite material.

According to the present invention, it is possible to provide an electroacoustic conversion film and an electroacoustic converter which are capable of suppressing a decrease in piezoelectric conversion efficiency in a case of use in a high-temperature environment.

DESCRIPTION OF THE PREFERRED EMBODIMENTS

Hereinafter, an electroacoustic conversion film and an electroacoustic converter according to the embodiment of the present invention will be described in detail based on the suitable examples shown in the accompanying drawings.

Descriptions of the constituent requirements described below may be made based on representative embodiments of the present invention, but the present invention is not limited to such embodiments.

In the present specification, a numerical range shown using "to" indicates a range including numerical values described before and after "to" as a lower limit and an upper limit.

[Electroacoustic Conversion Film]

The electroacoustic conversion film according to the embodiment of the present invention is an electroacoustic conversion film including a polymer-based piezoelectric composite material which contains piezoelectric particles in a matrix containing a polymer material, and electrode layers which are formed on both surfaces of the polymer-based piezoelectric composite material, in which the electroacoustic conversion film has a thermal expansion coefficient of 12 ppm/° C. to 100 ppm/° C.

Figure 1:
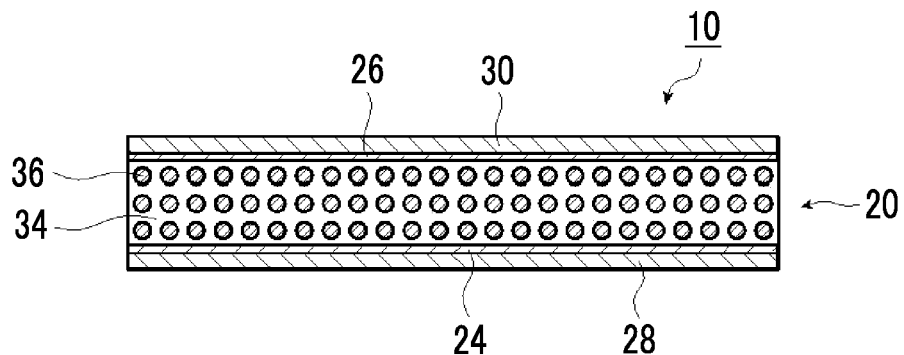
FIG. 1 is a conceptual view illustrating an example of an electroacoustic conversion film of the present invention.

FIG. 1 a cross-sectional view conceptually illustrates an example of the electroacoustic conversion film according to the embodiment of the present invention.

As illustrated in FIG. 1, an electroacoustic conversion film 10 includes a piezoelectric layer 20 which is a sheet-like material having piezoelectric properties, a lower electrode 24 to be laminated on one surface of the piezoelectric layer 20, a lower protective layer 28 to be laminated on the lower electrode 24, an upper electrode 26 to be laminated on the other surface of the piezoelectric layer 20, and an upper protective layer 30 to be laminated on the upper electrode 26.

The piezoelectric layer 20 contains piezoelectric particles 36 in a matrix 34 containing a polymer material. That is, the piezoelectric layer 20 is a polymer-based piezoelectric composite material according to the embodiment of the present invention. Further, the lower electrode 24 and the upper electrode 26 are electrode layers in the present invention. Further, the lower protective layer 28 and the upper protective layer 30 are protective layers in the present invention.

As will be described later, the electroacoustic conversion film 10 (piezoelectric layer 20) is polarized in the thickness direction as a preferred embodiment.

As an example, such an electroacoustic conversion film 10 is used in various acoustic devices (audio equipment) such as speakers, microphones, and pickups used in musical instruments such as guitars, to generate (reproduce) a sound due to vibration in response to an electrical signal or convert vibration due to a sound into an electrical signal.

Further, the electroacoustic conversion film can also be used in pressure sensitive sensors, power generation elements, and the like in addition to the examples described above.

[Piezoelectric Layer]

The piezoelectric layer 20 is a polymer-based piezoelectric composite material in the present invention and is obtained by allowing the matrix 34 containing a polymer material to contain the piezoelectric particles 36.

As the material of the matrix 34 (serving as a matrix and a binder) of the polymer-based piezoelectric composite material constituting the piezoelectric layer 20, a polymer material having viscoelasticity at room temperature is preferably used.

The electroacoustic conversion film 10 according to the embodiment of the present invention is suitably used for a speaker having flexibility such as a speaker for a flexible display. Here, it is preferable that the polymer-based piezoelectric composite material (piezoelectric layer 20) used for a speaker having flexibility satisfies the following requirements. Therefore, it is preferable that a polymer material having viscoelasticity at room temperature is used as a material satisfying the following requirements.

Further, in the present specification, the "room temperature" indicates a temperature range of approximately 0° C. to 50° C.

(i) Flexibility

For example, in a case of being gripped in a state of being loosely bent like a document such as a newspaper or a magazine as a portable device, the electroacoustic conversion film is continuously subjected to large bending deformation from the outside at a relatively slow vibration of less than or equal to a few Hz. In this case, in a case where the polymer-based piezoelectric composite material is hard, a large bending stress is generated to that extent, and a crack is generated at the interface between a matrix and piezoelectric particles, which may lead to breakage. Accordingly, the polymer-based piezoelectric composite material is required to have suitable flexibility. In addition, in a case where strain energy is diffused into the outside as heat, the stress is able to be relieved. Therefore, the polymer-based piezoelectric composite material is required to have a suitably large loss tangent.

(ii) Acoustic Quality

In a speaker, the piezoelectric particles vibrate at a frequency of an audio band of 20 Hz to 20 kHz, and the vibration energy causes the entire polymer-based piezoelectric composite material (electroacoustic conversion film) to vibrate integrally so that a sound is reproduced. Therefore, in order to increase the transmission efficiency of the vibration energy, the polymer-based piezoelectric composite material is required to have appropriate hardness. In addition, in a case where the frequencies of the speaker are smooth as the frequency characteristic thereof, an amount of change in acoustic quality in a case where the lowest resonance frequency is changed in association with a change in the curvature of the speaker decreases. Therefore, the loss tangent of the polymer-based piezoelectric composite material is required to be suitably large.

That is, the polymer-based piezoelectric composite material is required to exhibit a behavior of being rigid with respect to a vibration of 20 Hz to 20 kHz and being flexible with respect to a vibration of less than or equal to a few Hz. In addition, the loss tangent of a polymer-based piezoelectric composite material is required to be suitably large with respect to the vibration of all frequencies of 20 kHz or less.

In general, a polymer solid has a viscoelasticity relieving mechanism, and a molecular movement having a large scale is observed as a decrease (relief) in a storage elastic modulus (Young's modulus) or a maximal value (absorption) in a loss elastic modulus along with an increase in temperature or a decrease in frequency. Among them, the relief due to a microbrown movement of a molecular chain in an amorphous region is referred to as main dispersion, and an extremely large relieving phenomenon is observed. A temperature at which this main dispersion occurs is a glass transition point (Tg), and the viscoelasticity relieving mechanism is most remarkably observed.

In the polymer-based piezoelectric composite material (piezoelectric layer 20), the polymer-based piezoelectric composite material exhibiting a behavior of being rigid with respect to a vibration of 20 Hz to 20 kHz and being flexible with respect to a vibration of less than or equal to a few Hz is realized by using a polymer material whose glass transition point is room temperature, that is, a polymer material having viscoelasticity at room temperature as a matrix. In particular, from the viewpoint that such a behavior is suitably exhibited, it is preferable that a polymer material in which the glass transition temperature at a frequency of 1 Hz is at room temperature, that is, in a range of 0° C. to 50° C. is used for a matrix of the polymer-based piezoelectric composite material.

As the polymer material having viscoelasticity at room temperature, various known materials are able to be used as long as the materials have dielectric properties. It is preferable that a polymer material in which the maximal value of a loss tangent at a frequency of 1 Hz according to a dynamic viscoelasticity test at room temperature, that is, in a range of 0° C. to 50° is 0.5 or greater is used as the polymer material.

In this manner, in a case where the polymer-based piezoelectric composite material is slowly bent due to an external force, stress concentration on the interface between the matrix and the piezoelectric particles at the maximum bending moment portion is relieved, and thus satisfactory flexibility is obtained.

In the polymer material, it is preferable that a storage elastic modulus (E') at a frequency of 1 Hz according to the dynamic viscoelasticity measurement is 100 MPa or greater at 0° C. and 10 MPa or less at 50° C.

In this manner, the bending moment generated in a case where the polymer-based piezoelectric composite material is slowly bent due to the external force can be reduced, and the polymer-based piezoelectric composite material can exhibit a behavior of being rigid with respect to an acoustic vibration of 20 Hz to 20 kHz.

In addition, the relative dielectric constant of the polymer material is 10 or greater at 25° C. Accordingly, in a case where a voltage is applied to the polymer-based piezoelectric composite material, a higher electric field is applied to the piezoelectric particles in the matrix, and thus a large deformation amount is able to be expected.

However, in consideration of ensuring satisfactory moisture resistance and the like, it is suitable that the relative dielectric constant of the polymer material is 10 or less at 25° C.

Examples of the polymer material satisfying such conditions include cyanoethylated polyvinyl alcohol (cyanoethylated PVA), polyvinyl acetate, polyvinylidene chloride-co-acrylonitrile, a polystyrene-vinyl polyisoprene block copolymer, polyvinyl methyl ketone, and polybutyl methacrylate. In addition, as these polymer materials, a commercially available product such as Hybrar 5127 (manufactured by Kuraray Co., Ltd.) is also able to be suitably used. Among these, it is preferable to use a material containing a cyanoethyl group and particularly preferable to use cyanoethylated as the polymer material.

Further, these polymer materials may be used alone or in combination (mixture) of a plurality of kinds thereof.

In the matrix 34 for which such a polymer material is used, a plurality of polymer materials may be used in combination as necessary.

That is, for the purpose of adjusting dielectric properties, mechanical properties, and the like, other dielectric polymer materials may be added to the matrix 34 in addition to the polymer material having viscoelasticity at room temperature as necessary.

Examples of the dielectric polymer material that can be added thereto include a fluorine-based polymer such as polyvinylidene fluoride, a vinylidene fluoride-tetrafluoroethylene copolymer, a vinylidene fluoride-trifluoroethylene copolymer, a polyvinylidene fluoride-trifluoroethylene copolymer, or a polyvinylidene fluoride-tetrafluoroethylene copolymer, a polymer containing a cyano group or a cyanoethyl group such as a vinylidene cyanide-vinyl acetate copolymer, cyanoethyl cellulose, cyanoethyl hydroxysaccharose, cyanoethyl hydroxycellulose, cyanoethyl hydroxypullulan, cyanoethyl methacrylate, cyanoethyl acrylate, cyanoethyl hydroxyethyl cellulose, cyanoethyl amylose, cyanoethyl hydroxypropyl cellulose, cyanoethyl dihydroxypropyl cellulose, cyanoethyl hydroxypropyl amylose, cyanoethyl polyacrylamide, cyanoethyl polyacrylate, cyanoethyl pullulan, cyanoethyl polyhydroxymethylene, cyanoethyl glycidol pullulan, cyanoethyl saccharose, or cyanoethyl sorbitol, and synthetic rubber such as nitrile rubber or chloroprene rubber.

Among these, a polymer material containing a cyanoethyl group is suitably used.

Further, in the matrix 34 of the piezoelectric layer 20, the number of kinds of the dielectric polymer materials to be added in addition to the polymer material having viscoelasticity at room temperature such as cyanoethylated PVA is not limited to one, and a plurality of kinds of the materials may be added.

In addition, for the purpose of controlling the glass transition point, a thermoplastic resin such as a vinyl chloride resin, polyethylene, polystyrene, a methacrylic resin, polybutene, and isobutylene, and a thermosetting resin such as a phenol resin, a urea resin, a melamine resin, an alkyd resin, or mica may be added to the matrix 34 in addition to the dielectric polymer materials.

Further, for the purpose of improving the pressure sensitive adhesiveness, a viscosity imparting agent such as rosin ester, rosin, terpene, terpene phenol, or a petroleum resin may be added.

In the matrix 34 of the piezoelectric layer 20, the addition amount in a case of adding materials other than the polymer material having viscoelasticity such as cyanoethylated PVA is not particularly limited, but is preferably set to 30% by mass or less in terms of the proportion of the materials in the matrix 34.

In this manner, the characteristics of the polymer material to be added can be exhibited without impairing the viscoelastic relieving mechanism in the matrix 34, and thus preferable results, for example, an increase in the dielectric constant, improvement of the heat resistant, and improvement of the adhesiveness between the piezoelectric particles 36 and the electrode layer can be obtained.

The piezoelectric layer 20 is a polymer-based piezoelectric composite material in which the piezoelectric particles 36 are dispersed in the matrix 34.

The piezoelectric particles 36 consist of ceramic particles having a perovskite type or wurtzite type crystal structure.

As the ceramic particles forming the piezoelectric particles 36, for example, lead zirconate titanate (PZT), lead lanthanum zirconate titanate (PLZT), barium titanate (BaTiO₃), zinc oxide (ZnO), and a solid solution (BFBT) of barium titanate and bismuth ferrite (BiFe₃) are exemplified.

Only one of these piezoelectric particles 36 may be used, or a plurality of types thereof may be used in combination (mixture).

The particle diameter of the piezoelectric particles 36 is not limited, and may be appropriately selected depending on the size, usage, and the like of the polymer-based piezoelectric composite material (electroacoustic conversion film 10).

The particle diameter of the piezoelectric particles 36 is preferably in a range of 1 to 10 µm. By setting the particle diameter of the piezoelectric particles 36 to be in the above-described range, preferable results in terms of achieving both excellent piezoelectric characteristics and flexibility of the polymer-based piezoelectric composite material (electroacoustic conversion film 10) can be obtained.

In FIG. 1, the piezoelectric particles 36 in the piezoelectric layer 20 are uniformly dispersed in the matrix 34 with regularity, but the present invention is not limited thereto.

That is, the piezoelectric particles 36 in the piezoelectric layer 20 may be irregularly dispersed in the matrix 34 as long as the piezoelectric particles 36 are preferably uniformly dispersed therein.

In the piezoelectric layer 20 (polymer-based piezoelectric composite material), the ratio between the amount of the matrix 34 and the amount of the piezoelectric particles 36 in the piezoelectric layer 20 is not limited, and the ratio thereof may be appropriately set according to the size and the thickness of the piezoelectric layer 20 in the plane direction, the applications of the polymer-based piezoelectric composite material, the characteristics required for the polymer-based piezoelectric composite material, and the like.

The volume fraction of the piezoelectric particles 36 in the piezoelectric layer 20 is preferably in a range of 30% to 80%, more preferably 50% or greater, and still more preferably in a range of 50% to 80%.

By setting the ratio between the amount of the matrix 34 and the amount of the piezoelectric particles 36 to be in the above-described range, preferable results in terms of achieving both of excellent piezoelectric characteristics and flexibility can be obtained.

The thickness of the piezoelectric layer 20 is not limited, and may be appropriately set according to the applications of the polymer-based piezoelectric composite material, the characteristics required for the polymer-based piezoelectric composite material, and the like. It is advantageous that the thickness of the piezoelectric layer 20 increases in terms of the rigidity such as the strength of stiffness of a so-called sheet-like material, but the voltage (potential difference) required to stretch and contract the piezoelectric layer 20 by the same amount increases.

The thickness of the piezoelectric layer 20 is preferably in a range of 10 to 300 µm, more preferably in a range of 20 to 200 µm, and still more preferably in a range of 30 to 150 µm.

By setting the thickness of the piezoelectric layer 20 to be in the above-described range, preferable results in terms of achieving both ensuring of the rigidity and moderate elasticity can be obtained.

[Electrode Layer and Protective Layer]

As illustrated in FIG. 1, the electroacoustic conversion film 10 of the illustrated example has a configuration in which the lower electrode 24 is provided on one surface of the piezoelectric layer 20, the lower protective layer 28 is provided on the surface thereof, the upper electrode 26 is provided on the other surface of the piezoelectric layer 20, and the upper protective layer 30 is provided on the surface thereof. Here, the upper electrode 26 and the lower electrode 24 form an electrode pair.

In addition to these layers, the electroacoustic conversion film 10 includes an electrode lead portion that leads out the electrodes from the upper electrode 26 and the lower electrode 24, and the electrode lead portion is connected to a power source. Further, the electroacoustic conversion film 10 may have an insulating layer which covers a region where the piezoelectric layer 20 is exposed for preventing a short circuit or the like.

That is, the electroacoustic conversion film 10 has a configuration in which both surfaces of the piezoelectric layer 20 are interposed between the electrode pair, that is, the upper electrode 26 and the lower electrode 24 and the laminate is further interposed between the lower protective layer 28 and the upper protective layer 30.

As described above, in the electroacoustic conversion film 10, the region interposed between the upper electrode 26 and the lower electrode 24 is stretched and contracted according to an applied voltage.

In the electroacoustic conversion film 10, the lower protective layer 28 and the upper protective layer 30 are provided as a preferred embodiment rather than essential constituent requirements.

The lower protective layer 28 and the upper protective layer 30 have a function of covering the upper electrode 26 and the lower electrode 24 and applying moderate rigidity and mechanical strength to the piezoelectric layer 20. That is, the piezoelectric layer 20 consisting of the matrix 34 and the piezoelectric particles 36 in the electroacoustic conversion film 10 exhibits extremely excellent flexibility under bending deformation at a slow vibration, but may have insufficient rigidity or mechanical strength depending on the applications. As a compensation for this, the electroacoustic conversion film 10 is provided with the lower protective layer 28 and the upper protective layer 30.

The lower protective layer 28 and the upper protective layer 30 are not limited, and various sheet-like materials can be used, and suitable examples thereof include various resin films.

Among these, from the viewpoints of excellent mechanical properties and heat resistance, a resin film consisting of polyethylene terephthalate (PET), polypropylene (PP), polystyrene (PS), polycarbonate (PC), polyphenylene sulfide (PPS), polymethylmethacrylate (PMMA), polyetherimide (PEI), polyimide (PI), polyethylene naphthalate (PEN), triacetyl cellulose (TAC), and a cyclic olefin-based resin is suitably used.

The thickness of the lower protective layer 28 or the upper protective layer 30 is not limited. In addition, the thicknesses of the lower protective layer 28 and the upper protective layer 30 are basically the same as each other, but may be different from each other.

Here, in a case where the rigidity of the lower protective layer 28 and the upper protective layer 30 is extremely high, not only is the stretch and contraction of the piezoelectric layer 20 constrained, but also the flexibility is impaired. Therefore, it is advantageous that the thickness of the lower protective layer 28 and the thickness of the upper protective layer 30 decrease except for the case where the mechanical strength or excellent handleability as a sheet-like material is required.

In a case where the thickness of the lower protective layer 28 and the upper protective layer 30 in the electroacoustic conversion film 10 is two times or less the thickness of the piezoelectric layer 20, preferable results in terms of achieving both ensuring of the rigidity and moderate elasticity can be obtained.

For example, in a case where the thickness of the piezoelectric layer 20 is 50 μm and the lower protective layer 28 and the upper protective layer 30 consist of PET, the thickness of the lower protective layer 28 and the upper protective layer 30 is preferably 100 μm or less, more preferably 50 μm or less, and still more preferably 25 μm or less.

In the electroacoustic conversion film 10, the lower electrode 24 is formed between the piezoelectric layer 20 and the lower protective layer 28, and the upper electrode 26 is formed between the piezoelectric layer 20 and the upper protective layer 30.

The lower electrode 24 and the upper electrode 26 are provided to apply a driving voltage to the piezoelectric layer 20.

In the present invention, the material for forming the lower electrode 24 and the upper electrode 26 is not limited, and various conductors can be used as the material. Specific examples thereof include carbon, palladium, iron, tin, aluminum, nickel, platinum, gold, silver, copper, titanium, chromium, and molybdenum, alloys thereof, laminates and composites of these metals and alloys, and indium tin oxide. Among these, copper, aluminum, gold, silver, platinum, and indium-tin oxide are suitably as the lower electrode 24 and the upper electrode 26.

In addition, the method of forming the lower electrode 24 and the upper electrode 26 is not limited, and various known methods such as a vapor-phase deposition method (a vacuum film forming method) such as vacuum vapor deposition or sputtering, film formation using plating, and a method of bonding a foil formed of the materials described above can be used.

Among these, particularly from the viewpoint of ensuring the flexibility of the electroacoustic conversion film 10, a thin film made of copper, aluminum, or the like formed by vacuum vapor deposition is suitably used as the lower electrode 24 and the upper electrode 26. Among these, particularly a thin film made of copper formed by vacuum vapor deposition is suitably used.

The thickness of the lower electrode 24 and the upper electrode 26 is not limited. In addition, the thicknesses of the lower electrode 24 and the upper electrode 26 are basically the same as each other, but may be different from each other.

Here, similarly to the lower protective layer 28 and upper protective layer 30 described above, in a case where the rigidity of the lower electrode 24 and the upper electrode 26 is extremely high, not only is the stretch and contraction of the piezoelectric layer 20 constrained, but also the flexibility is impaired. Therefore, it is advantageous that the thicknesses of lower electrode 24 and the upper electrode 26 decrease in a case where the electrical resistance is not excessively high. That is, it is preferable that the lower electrode 24 and the upper electrode 26 are thin film electrodes.

It is suitable that the product of the thicknesses of the lower electrode 24 and the upper electrode 26 of the electroacoustic conversion film 10 and the Young's modulus thereof is less than the product of the thicknesses of the lower protective layer 28 and the upper protective layer 30 and the Young's modulus thereof because the flexibility is not considerably impaired.

For example, in a case of a combination consisting of the lower protective layer 28 and the upper protective layer 30 formed of PET (Young's modulus: approximately 6.2 GPa) and the lower electrode 24 and the upper electrode 26 formed of copper (Young's modulus: approximately 130 GPa), the thickness of the lower electrode 24 and the upper electrode 26 is preferably 1.2 μm or less, more preferably 0.3 μm or less, and still more preferably 0.1 μm or less in a case of assuming that the thickness of the lower protective layer 28 and the upper protective layer 30 is 25 μm.

It is preferable that, in the electroacoustic conversion film 10, the maximal value of the loss tangent (tan δ) at a frequency of 1 Hz according to dynamic viscoelasticity measurement is present at room temperature and more preferable that the maximal value at which the loss tangent is 0.1 or greater is present at room temperature.

In this manner, even in a case where the electroacoustic conversion film 10 is subjected to bending deformation at a slow vibration of less than or equal to a few Hz from the outside, since the strain energy can be effectively diffused to the outside as heat, occurrence of cracks on the interface between the matrix and the piezoelectric particle can be prevented.

In the electroacoustic conversion film 10, it is preferable that the storage elastic modulus (E') at a frequency of 1 Hz according to the dynamic viscoelasticity measurement is in a range of 10 GPa to 30 GPa at 0° C. and in a range of 1 GPa to 10 GPa at 50° C. The same applies to the conditions for the piezoelectric layer 20.

In this manner, the electroacoustic conversion film 10 may have large frequency dispersion in the storage elastic modulus (E'). That is, the electroacoustic conversion film 10 can exhibit a behavior of being rigid with respect to a vibration of 20 Hz to 20 kHz and being flexible with respect to a vibration of less than or equal to a few Hz.

In the electroacoustic conversion film 10, it is preferable that the product of the thickness and the storage elastic modulus at a frequency of 1 Hz according to the dynamic viscoelasticity measurement is in a range of $1.0 \times 10^5$ to $2.0 \times 10^6$ (1.0E+05 to 2.0E+06) N/m at 0° C. and in a range of $1.0 \times 10^5$ to $1.0 \times 10^6$ (1.0E+05 to 1.0E+06) N/m at 50° C. The same applies to the conditions for the piezoelectric layer 20.

In this manner, the electroacoustic conversion film 10 may have moderate rigidity and mechanical strength within a range not impairing the flexibility and the acoustic properties.

Further, in the electroacoustic conversion film 10, it is preferable that the loss tangent at a frequency of 1 kHz at 25° C. is 0.05 or greater in a master curve obtained from the dynamic viscoelasticity measurement. The same applies to the conditions for the piezoelectric layer 20.

In this manner, the frequency of a speaker using the electroacoustic conversion film 10 is smooth as the frequency characteristic thereof, and thus a change in acoustic quality in a case where the lowest resonance frequency $f_0$ is changed according to a change in the curvature of the speaker can be decreased.

In the present invention, the storage elastic modulus (Young's modulus) and the loss tangent of the electroacoustic conversion film 10, the piezoelectric layer 20, and the like may be measured by a known method. As an example, the measurement may be performed using a dynamic viscoelasticity measuring device DMS6100 (manufactured by SII Nanotechnology Inc.).

Examples of the measurement conditions include a measurement frequency of 0.1 to 20 Hz (0.1 Hz, 0.2 Hz, 0.5 Hz, 1 Hz, 2 Hz, 5 Hz, 10 Hz, and 20 Hz), a measurement temperature of −50° C. to 150° C., a temperature rising rate of 2° C./min (in a nitrogen atmosphere), a sample size of 40 mm×10 mm (including the clamped region), and a chuck-to-chuck distance of 20 mm.

Here, the electroacoustic conversion film according to the embodiment of the present invention has a thermal expansion coefficient of 12 ppm/° C. to 100 ppm/° C.

As described above, based on the examination conducted by the present inventors, it was found that in a case where an electroacoustic conversion film obtained by using a polymer-based piezoelectric composite material containing piezoelectric particles in a matrix is used as a speaker and is used in a high-temperature environment, a problem of a decrease in sound pressure occurs.

As a result of further examination on this point, it was found that in a case where the temperature of the polymer-based piezoelectric composite material increases, the polymer material that is the matrix stretches due to heat, and thus the distance between the piezoelectric particles contained in the matrix is widened.

As described above, in the electroacoustic conversion film obtained by using a polymer-based piezoelectric composite material containing piezoelectric particles in a matrix containing a polymer material, the piezoelectric particles in the polymer-based piezoelectric composite material are deformed (vibrated) by applying a voltage to the electrode layers laminated on both surfaces of the polymer-based piezoelectric composite material, and the entire electroacoustic conversion film is deformed (vibrated) by transmitting the deformation of the piezoelectric particles to the matrix.

Here, in a case where the distance between the piezoelectric particles contained in the matrix is widened, the deformation of the piezoelectric particles during the application of the voltage to the electrodes of the electroacoustic conversion film is unlikely to be transmitted to the matrix, and the thus piezoelectric conversion efficiency is degraded.

Therefore, since the piezoelectric conversion efficiency of the electroacoustic conversion film is degraded in a high-temperature environment, the sound pressure is lowered in a case where the electroacoustic conversion film is used as a speaker.

On the contrary, in the electroacoustic conversion film according to the embodiment of the present invention, expansion of the matrix of the polymer-based piezoelectric composite material in a high-temperature environment is suppressed and the widening of the distance between the piezoelectric particles contained in the matrix is suppressed by setting the thermal expansion coefficient of the electroacoustic conversion film to be in a range of 12 ppm/° C. to 100 ppm/° C. In this manner, the deformation (vibration) of the piezoelectric particles is more suitably transmitted to the matrix, and thus degradation of the piezoelectric conversion efficiency of the electroacoustic conversion film can be suppressed.

Further, in a case where the thermal expansion coefficient of the electroacoustic conversion film is less than 12 ppm/° C., that is, in a case where the thermal expansion coefficient of the electroacoustic conversion film is extremely low, the piezoelectric layer may be brittle and destroyed. From this viewpoint, the thermal expansion coefficient of the electroacoustic conversion film is 12 ppm/° C. or greater.

From the viewpoint of more suitably suppressing degradation of the piezoelectric conversion efficiency of the electroacoustic conversion film in a high-temperature environment and suppressing destruction of the piezoelectric layer, the thermal expansion coefficient of the electroacoustic conversion film is preferably in a range of 12 ppm/° C. to 100 ppm/° C., more preferably in a range of 16 ppm/° C. to 70 ppm/° C., and still more preferably in a range of 18 ppm/° C. to 55 ppm/° C.

Here, the thermal expansion coefficient of the electroacoustic conversion film is obtained by, for example, measuring the thermomechanical characteristics using a thermomechanical analyzer (TMA4000SE, manufactured by NETZSCH Japan K. K.). As the measurement conditions, for example, the sample size is set to 5 mm×20 mm, the distance between chucks is set to 15 mm, the lengths of both the upper chuck and the lower chuck are set to 2.5±0.5 mm, and the temperature is changed in a range of −20° C. to 60° C. at 5° C./min, and the amount of displacement of the distance between chucks is measured. Further, the measurement is performed by applying a constant load of 3 g to the sample as the load. Subsequently, the inclination of the approximate straight line of the data related to the amount of displacement in a temperature range of −20° C. to 60° C. is acquired, and the amount of displacement per 1° C. change in temperature is acquired. Further, the thermal expansion coefficient can be calculated by dividing the inclination by 15 mm, which is the distance between chucks during the setting of the sample.

Examples of a method of setting the thermal expansion coefficient of the electroacoustic conversion film to be in the above-described range include a method of applying and drying a coating material which is a piezoelectric layer (polymer-based piezoelectric composite material) during the preparation of the electroacoustic conversion film, performing a polarization treatment described below, laminating the upper electrode layer (and the upper protective layer), heating the laminate, and performing an aging treatment thereon. The aging treatment varies depending on the matrix material and the like, but may be performed under conditions of a temperature of 40° C. to 70° C. for 12 hours to 72 hours. The aging treatment may be performed before the upper electrode layer (and the upper protective layer) is laminated or before the polarization treatment is performed.

The polymer material serving as the matrix of the polymer-based piezoelectric composite material is entangled, strengthened, and stabilized by performing the aging treatment, and the thermal expansion coefficient thereof is smaller than that of the material which has not been subjected to the aging treatment.

Alternatively, a method of applying and drying a coating material which is a piezoelectric layer (polymer-based piezoelectric composite material) and performing vacuum drying may be used as the method of setting the thermal expansion coefficient of the electroacoustic conversion film to be in the above-described range. The thermal expansion coefficient of the electroacoustic conversion film can be decreased by performing vacuum drying to remove the voids (air) remaining in the piezoelectric layer.

The vacuum drying may be performed under the conditions of a temperature of 25° C. to 40° C. and a pressure of 10 Pa to 50 Pa for 48 hours to 144 hours.

Alternatively, a method of increasing the proportion of the piezoelectric particles in the polymer-based piezoelectric composite material may be used as the method of setting the thermal expansion coefficient of the electroacoustic conversion film to be in the above-described range. Since the thermal expansion coefficient of the polymer material serving as the matrix is higher than that of the piezoelectric particles, the thermal expansion of the electroacoustic conversion film can be decreased by increasing the proportion of the piezoelectric particles and decreasing the proportion of the matrix (polymer material).

From this viewpoint, the proportion of the piezoelectric particles in the polymer-based piezoelectric composite material is preferably in a range of 30% to 80% and more preferably in a range of 50% to 80%.

The hygric expansion coefficient of the electroacoustic conversion film according to the embodiment of the present invention in a temperature environment of 25° C. is set to be preferably in a range of 1 to 30 ppm/% RH and more preferably in a range of 3 to 20 ppm/% RH. Further, the hygric expansion coefficient thereof in a temperature environment of 60° C. is set to be preferably in a range of 3 to 40 ppm/% RH and more preferably in a range of 5 to 30 ppm/% RH. By setting the hygric expansion coefficient to be in such a range, a decrease in sound pressure in a high-humidity environment can be suppressed.

Next, an example of the method of producing the electroacoustic conversion film 10 will be described with reference to FIGS. 2 to 4.

Figure 2:
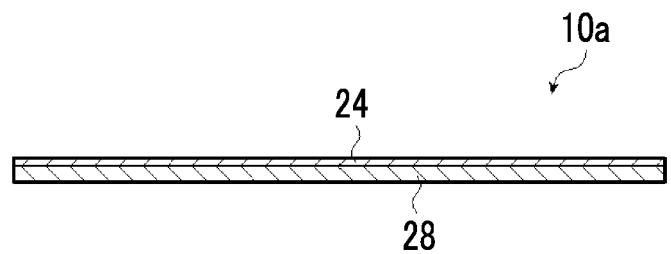
FIG. 2 is a conceptual view for describing an example of a method of preparing the electroacoustic conversion film.
Figure 3:
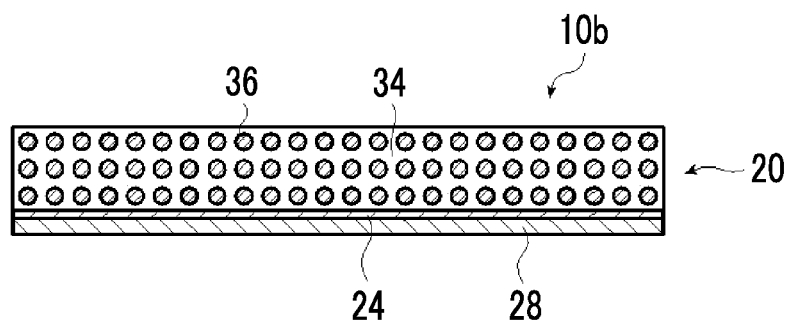
FIG. 3 is a conceptual view for describing an example of the method of preparing the electroacoustic conversion film.

First, as illustrated in FIG. 2, a sheet-like material 10a in which the lower electrode 24 is formed on the lower protective layer 28 is prepared. The sheet-like material 10a may be prepared by forming a copper thin film or the like as the lower electrode 24 on the surface of the lower protective layer 28 by carrying out vacuum vapor deposition, sputtering, plating, or the like.

In a case where the lower protective layer 28 is extremely thin and thus the handleability is degraded, the lower protective layer 28 with a separator (temporary support) may be used as necessary. Further, a PET having a thickness of 25 μm to 100 μm or the like can be used as the separator. The separator may be removed after thermal compression bonding of the upper electrode 26 and the upper protective layer 30 and before lamination of any member on the lower protective layer 28.

Meanwhile, the coating material is prepared by dissolving a polymer material serving as a material of the matrix in an organic solvent, adding the piezoelectric particles 36 such as PZT particles thereto, and stirring the solution for dispersion.

The organic solvent other than the above-described substances is not limited, and various organic solvents can be used.

As described above, since the thermal expansion coefficient of the electroacoustic conversion film changes depending on the proportion of the piezoelectric particles in the polymer-based piezoelectric composite material, the coating material may be prepared such that the proportion of the piezoelectric particles in the polymer-based piezoelectric composite material reaches a desired proportion.

In a case where the sheet-like material 10a is prepared and the coating material is prepared, the coating material is cast (applied) onto the sheet-like material 10a, and the organic solvent is evaporated and dried. Accordingly, as illustrated in FIG. 3, a laminate 10b in which the lower electrode 24 is provided on the lower protective layer 28 and the piezoelectric layer 20 is formed on the lower electrode 24 is produced. Further, the lower electrode 24 indicates an electrode on the base material side in a case where the piezoelectric layer 20 is applied, and does not indicate the vertical positional relationship in the laminate.

Here, as described above, the coating material is applied and dried, and may be further vacuum-dried in order to lower the thermal expansion coefficient of the electroacoustic conversion film. The thermal expansion coefficient of the electroacoustic conversion film to be prepared can be decreased by performing vacuum drying to remove the voids (air) remaining in the piezoelectric layer.

A casting method of the coating material is not limited, and all known methods (coating devices) such as a slide coater or a doctor knife can be used.

As described above, in the electroacoustic conversion film 10, in addition to the viscoelastic material such as cyanoethylated PVA, a dielectric polymer material may be added to the matrix 34.

In a case where the polymer material is added to the matrix 34, the polymer material added to the coating material may be dissolved.

In a case where the laminate 10b in which the lower electrode 24 is provided on the lower protective layer 28 and the piezoelectric layer 20 is formed on the lower electrode 24 is prepared, it is preferable that the piezoelectric layer 20 is subjected to a polarization treatment (poling).

A method of performing the polarization treatment on the piezoelectric layer 20 is not limited, and a known method can be used.

Before the polarization treatment, a calendar treatment may be performed to smoothen the surface of the piezoelectric layer 20 using a heating roller or the like. By performing the calendar treatment, a thermal compression bonding step described below can be smoothly performed.

In this manner, while the piezoelectric layer 20 of the laminate 10b is subjected to the polarization treatment, a sheet-like material 10c in which the upper electrode 26 is formed on the upper protective layer 30 is prepared. The sheet-like material 10c may be prepared by forming a copper thin film or the like as the upper electrode 26 on the surface of the upper protective layer 30 using vacuum vapor deposition, sputtering, plating, or the like.

Figure 4:
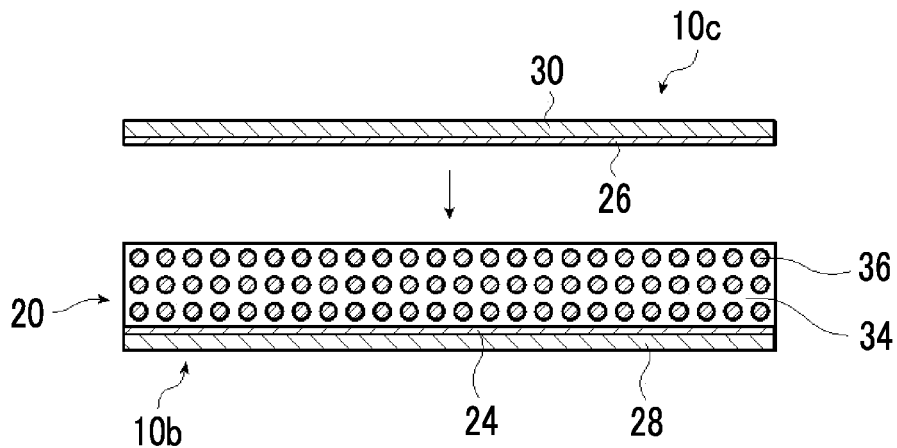
FIG. 4 is a conceptual view for describing an example of the method of preparing the electroacoustic conversion film.

Next, as illustrated in FIG. 4, the sheet-like material 10c is laminated on the laminate 10b in which the polarization treatment performed on the piezoelectric layer 20 is completed in a state where the upper electrode 26 is directed toward the piezoelectric layer 20.

Further, a laminate of the laminate 10b and the sheet-like material 10c is subjected to the thermal compression bonding using a heating press device, a heating roller pair, or the like such that the upper protective layer 30 and the lower protective layer 28 are interposed between the laminate 10b and the sheet-like material 10c.

Here, as described above, it is preferable that the laminate 10b and the sheet-like material 10c are heated and subjected to an aging treatment after being subjected to the thermal compression bonding. By performing the aging treatment, the thermal expansion coefficient of the electroacoustic conversion film can be lowered.

The electroacoustic conversion film 10 is prepared by performing the above-described steps. The prepared electroacoustic conversion film 10 may be cut into a desired shape according to various applications.

The laminated piezoelectric element 14 described below has a configuration in which the electroacoustic conversion films 10 according to the embodiment of the present invention are laminated and bonded to each other using a bonding layer 19 as a preferred embodiment. In the laminated piezoelectric element 14 illustrated in FIG. 7, as indicated by the arrows shown in the piezoelectric layer 20 as a preferred embodiment, the polarization directions of the electroacoustic conversion films 10 adjacent to each other are opposite to each other.

A typical laminated ceramic piezoelectric element in which piezoelectric ceramic materials are laminated is subjected to a polarization treatment after preparation of a laminate of the piezoelectric ceramic materials. Only common electrodes exist at the interface between the piezoelectric layers, and thus the polarization directions of the piezoelectric layers alternate in the lamination direction.

On the contrary, the laminated piezoelectric element obtained by using the electroacoustic conversion film 10 according to the embodiment of the present invention can be subjected to the polarization treatment in a state of the electroacoustic conversion film 10 before lamination. It is preferable that the electroacoustic conversion film 10 is subjected to the polarization treatment of the piezoelectric layer 20 before the lamination of the upper electrode 26 and the upper protective layer 30.

Therefore, the laminated piezoelectric element obtained by using the electroacoustic conversion film according to the embodiment of the present invention can be prepared by laminating the electroacoustic conversion films 10 after being subjected to the polarization treatment. It is preferable that a long electroacoustic conversion film (an electroacoustic conversion film with a large area) on which the polarization treatment has been performed is prepared and cut into individual electroacoustic conversion films 10, and the electroacoustic conversion films 10 are laminated to form the laminated piezoelectric element 14.

Figure 7:
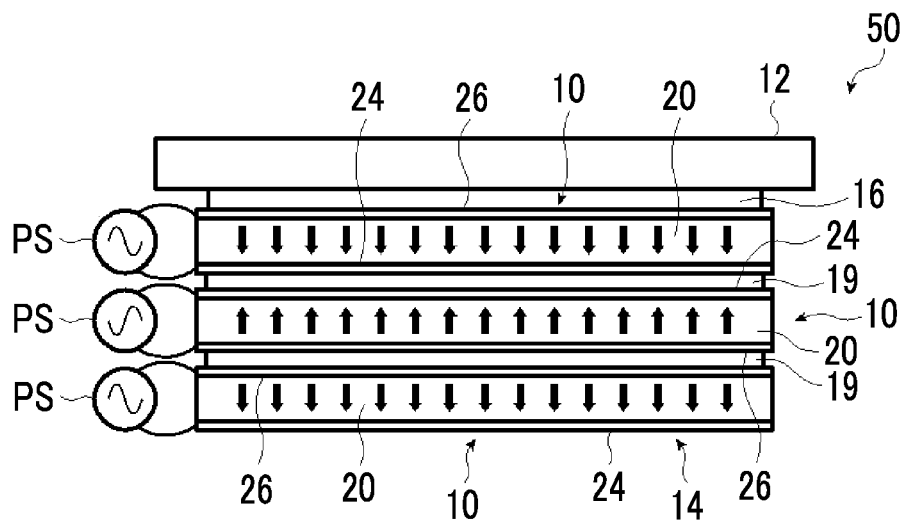
FIG. 7 is a conceptual view illustrating an example of an electroacoustic converter including a laminated piezoelectric element obtained by laminating electroacoustic conversion films.
Figure 9:
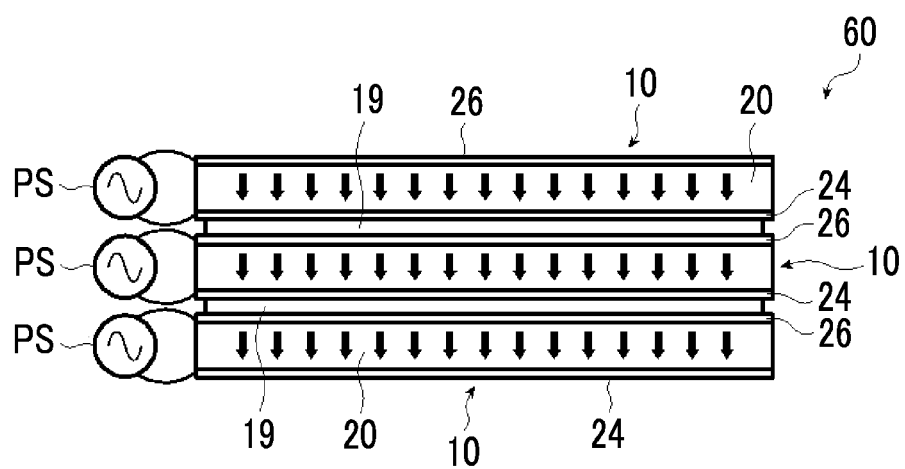
FIG. 9 is a conceptual view illustrating another example of a laminated piezoelectric element.

Therefore, in the laminated piezoelectric element obtained by using the electroacoustic conversion film according to the embodiment of the present invention, the polarization directions of the electroacoustic conversion films 10 adjacent to each other can be aligned in the lamination direction as in a laminated piezoelectric element 60 illustrated in FIG. 9, or can be alternated as in the laminated piezoelectric element 14 illustrated in FIG. 7.

Further, it is known that in a case where a typical electroacoustic conversion film consisting of a polymer material such as polyvinylidene fluoride (PVDF) is subjected to a stretching treatment in a uniaxial direction after the polarization treatment, the molecular chains are aligned with respect to the stretching direction, and as a result, excellent piezoelectric characteristics are obtained in the stretching direction. Therefore, a typical electroacoustic conversion film has in-plane anisotropy as a piezoelectric characteristic and has anisotropy in the amount of stretch and contraction in the plane direction in a case where a voltage is applied.

On the contrary, the polymer-based piezoelectric composite material which is included in the electroacoustic conversion film according to the embodiment of the present invention and contains the piezoelectric particles 36 in the matrix 34 achieves excellent piezoelectric characteristics without performing the stretching treatment after the polarization treatment. Therefore, the polymer-based piezoelectric composite material according to the embodiment of the present invention has no in-plane anisotropy as a piezoelectric characteristic, and stretches and contracts isotropically in all directions in an in-plane direction in a case where a driving voltage is applied as described later.

Such an electroacoustic conversion film 10 according to the embodiment of the present invention may be produced by using a cut sheet-like material, but preferably roll-to-roll (hereinafter, also referred to as RtoR) is used.

As is well known, RtoR is a production method of pulling out a long raw material from a roll around which the raw material is wound, performing various treatments such as film formation and a surface treatment while transporting the raw material in the longitudinal direction, and winding the treated raw material into a roll shape again.

In a case where the electroacoustic conversion film 10 is produced by the above-described production method according to RtoR, a first roll obtained by winding the sheet-like material 10a having the lower electrode 24 formed on the long lower protective layer 28, and a second roll obtained by winding the sheet-like material 10c having the upper electrode 26 formed on the long upper protective layer 30 are used.

The first roll and the second roll may be exactly the same as each other.

The sheet-like material 10a is pulled out from the roll, coated with a coating material containing the matrix 34 and the piezoelectric particles 36 while being transported in the longitudinal direction, and dried by being heated or the like to form the piezoelectric layer 20 on the lower electrode 24, thereby obtaining the laminate 10b described above.

Next, the piezoelectric layer 20 is subjected to a polarization treatment. Here, in a case where the electroacoustic conversion film 10 is produced by RtoR, the polarization treatment is performed on the piezoelectric layer 20. Before the polarization treatment, the calendar treatment may be performed as described above.

Next, the sheet-like material 10c is laminated on the laminate 10b in a state where the upper electrode 26 is directed toward the piezoelectric layer 20 as described above according to a known method of pulling out the sheet-material 10c from a second roll and utilizing a bonding roller or the like while transporting the sheet-like material 10c and the laminate.

Thereafter, the laminate 10b and the sheet-like material 10c which have been laminated are interposed and transported between a pair of heating rollers to be subjected to thermal compression bonding to complete the electroacoustic conversion film 10 according to the embodiment of the present invention, and the electroacoustic conversion film 10 is wound in a roll shape.

In the above-described example, the electroacoustic conversion film 10 according to the embodiment of the present invention is prepared by transporting the sheet-like material (laminate) only once in the longitudinal direction by RtoR, but the present invention is not limited thereto.

For example, the above-described laminate 10b is formed, the polarization treatment is performed, and the laminate is wound once into a roll shape to obtain a laminate roll. Next, the laminate is pulled out from the laminate roll, the sheet-like material in which the upper electrode 26 is formed on the upper protective layer 30 is laminated as described above while the laminate is transported in the longitudinal direction, the electroacoustic conversion film 10 is completed, and the electroacoustic conversion film 10 may be wound into a roll shape.

In a case where a voltage is applied to the lower electrode 24 and the upper electrode 26 of the electroacoustic conversion film 10, the piezoelectric particles 36 stretch and contract in the polarization direction according to the applied voltage. As a result, the electroacoustic conversion film 10 (piezoelectric layer 20) contracts in the thickness direction. At the same time, the electroacoustic conversion film 10 stretches and contracts in the in-plane direction due to the Poisson's ratio. The degree of stretch and contraction is approximately in a range of 0.01% to 0.1%. In the in-plane direction, the electroacoustic conversion film 10 stretches and contracts isotropically in all directions as described above.

As described above, the thickness of the piezoelectric layer 20 is preferably approximately 10 to 300 μm. Therefore, the degree of stretch and contraction in the thickness direction is as extremely small as approximately 0.3 μm at the maximum.

On the contrary, the electroacoustic conversion film 10, that is, the piezoelectric layer 20, has a size much larger than the thickness in the plane direction. Therefore, for example, in a case where the length of the electroacoustic conversion film 10 is 20 cm, the electroacoustic conversion film 10 stretches and contracts by a maximum of approximately 0.2 mm by the application of a voltage.

Further, in a case where a pressure is applied to the electroacoustic conversion film 10, electric power is generated by the action of the piezoelectric particles 36.

By utilizing this, the electroacoustic conversion film 10 can be used for various applications such as a speaker, a microphone, and a pressure sensitive sensor as described above.

[Piezoelectric Speaker]

Figure 5:
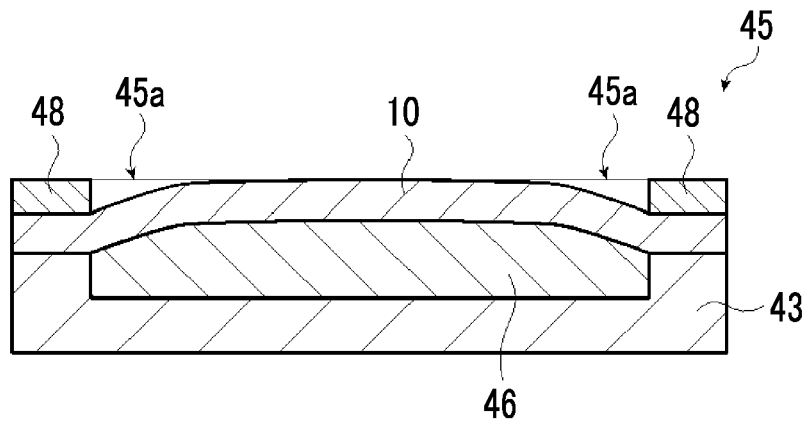
FIG. 5 is a conceptual view illustrating an example of a piezoelectric speaker including the electroacoustic conversion film illustrated in FIG. 1.

FIG. 5 is a conceptual view illustrating an example of a flat plate type piezoelectric speaker including the electroacoustic conversion film 10 according to the embodiment of the present invention.

The piezoelectric speaker 45 is a flat plate type piezoelectric speaker that uses the electroacoustic conversion film 10 according to the embodiment of the present invention as a vibration plate that converts an electrical signal into vibration energy. Further, the piezoelectric speaker 45 can also be used as a microphone, a sensor, or the like.

The piezoelectric speaker 45 is configured to include the electroacoustic conversion film 10, a case 43, a viscoelastic support 46, and a frame 48.

The case 43 is a thin regular square tubular housing formed of plastic or the like and having one surface that is open.

The frame 48 is a plate material having a through-hole at the center and having the same shape as the upper end surface (open surface side) of the case 43.

The viscoelastic support 46 is a support used for efficiently converting the stretch and contraction movement of the electroacoustic conversion film 10 into a forward and rearward movement (a movement in the direction perpendicular to the surface of the film) by means of having moderate viscosity and elasticity, supporting the electroacoustic conversion film 10, and applying a constant mechanical bias to any place of the electroacoustic conversion film. Examples of the viscoelastic support 46 include wool felt, nonwoven fabric such as wool felt containing rayon and PET, and glass wool.

The piezoelectric speaker 45 is configured by accommodating the viscoelastic support 46 in the case 43, covering the case 43 and the viscoelastic support 46 with the electroacoustic conversion film 10, and fixing the frame 48 to the case 43 in a state of pressing the periphery of the electroacoustic conversion film 10 against the upper end surface of the case 43 by the frame 48.

Here, in the piezoelectric speaker 45, the viscoelastic support 46 has a square columnar shape whose height (thickness) is larger than the height of the inner surface of the case 43.

Therefore, in the piezoelectric speaker 45, the viscoelastic support 46 is held in a state of being thinned by being pressed downward by the electroacoustic conversion film 10 at the peripheral portion of the viscoelastic support 46. Similarly, in the peripheral portion of the viscoelastic support 46, the curvature of the electroacoustic conversion film 10 suddenly fluctuates, and a rising portion 45a that decreases in height toward the periphery of the viscoelastic support 46 is formed in the electroacoustic conversion film 10. Further, the central region of the electroacoustic conversion film 10 is pressed by the viscoelastic support 46 having a square columnar shape and has a (approximately) planar shape.

In the piezoelectric speaker 45, in a case where the electroacoustic conversion film 10 is stretched in the in-plane direction due to the application of a driving voltage to the lower electrode 24 and the upper electrode 26, the rising portion 45a of the electroacoustic conversion film 10 changes in angle in a rising direction due to the action of the viscoelastic support 46 in order to absorb the stretched part. As a result, the electroacoustic conversion film 10 having the planar portion moves upward.

On the contrary, in a case where the electroacoustic conversion film 10 contracts in the in-plane direction due to the application of the driving voltage to the lower electrode 24 and the upper electrode 26, the rising portion 45a of the electroacoustic conversion film 10 changes the angle in a falling direction (a direction approaching the flat surface) in order to absorb the contracted portion. As a result, the electroacoustic conversion film 10 having the planar portion moves downward.

The piezoelectric speaker 45 generates a sound by the vibration of the electroacoustic conversion film 10.

In the electroacoustic conversion film 10 according to the embodiment of the present invention, the conversion from the stretching and contracting movement to vibration can also be achieved by holding the electroacoustic conversion film 10 in a curved state.

Therefore, the electroacoustic conversion film 10 according to the embodiment of the present invention can function as a speaker having flexibility by being simply held in a curved state instead of the piezoelectric speaker 45.

[Electroacoustic Converter]

An electroacoustic converter according to the embodiment of the present invention is an electroacoustic converter including an electroacoustic conversion film which includes a polymer-based piezoelectric composite material containing piezoelectric particles in a matrix containing a polymer material and electrode layers which are formed on both surfaces of the polymer-based piezoelectric composite material, and a vibration plate which is laminated on the electroacoustic conversion film, in which the electroacoustic converter has a thermal expansion coefficient of 12 ppm/° C. to 100 ppm/° C.

Figure 6:
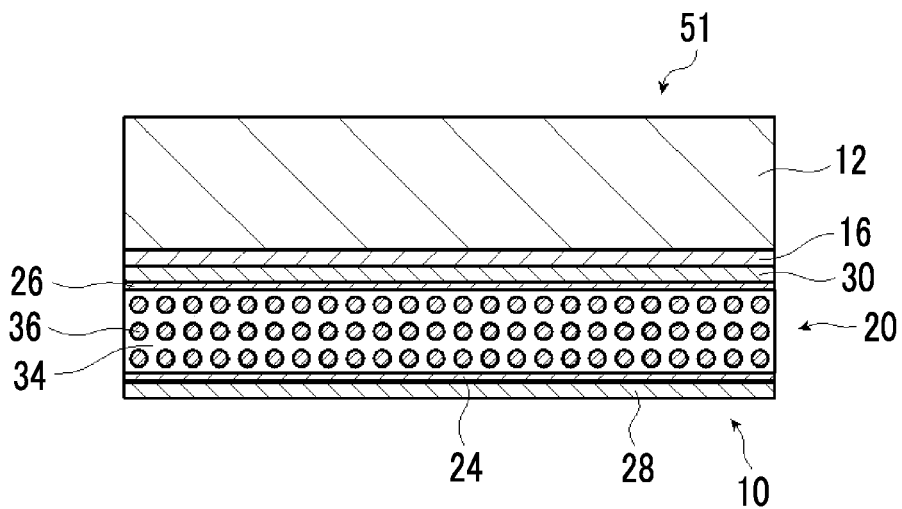
FIG. 6 is a conceptual view illustrating an example of an electroacoustic converter including an electroacoustic conversion film.

FIG. 6 conceptually illustrates an example of the electroacoustic converter according to the embodiment of the present invention, which includes the electroacoustic conversion film according to the embodiment of the present invention.

An electroacoustic converter 51 illustrated in FIG. 6 includes the electroacoustic conversion film 10 and the vibration plate 12. The electroacoustic conversion film 10 is the electroacoustic conversion film 10 according to the embodiment of the present invention.

In the electroacoustic converter 51, the electroacoustic conversion film 10 and the vibration plate 12 are bonded to each other with a bonding layer 16.

Power sources PS for applying a driving voltage are connected to the electroacoustic conversion films 10 of the electroacoustic converter 51.

In FIG. 6, the electroacoustic conversion film 10 has the lower protective layer 28 and the upper protective layer 30. However, in the electroacoustic converter 51 illustrated in FIG. 6, the electroacoustic conversion film 10 may be configured without the lower protective layer 28 and/or the upper protective layer 30. In the example illustrated in FIG. 6, the electroacoustic converter 51 may be configured to have only the lower protective layer 28 without the protective layer (upper protective layer 30) on the vibration plate 12 side, as an example.

In a case where a driving voltage is applied to the electroacoustic conversion film 10 in the electroacoustic converter 51, the electroacoustic conversion film 10 stretches and contracts in the plane direction, the stretching and contracting of the electroacoustic conversion film 10 causes the vibration plate 12 to bend, and as a result, the vibration plate 12 vibrates in the thickness direction. The vibration plate 12 generates a sound due to the vibration in the thickness direction. The vibration plate 12 vibrates according to the magnitude of the driving voltage applied to the electroacoustic conversion film 10, and generates a sound according to the driving voltage applied to the electroacoustic conversion film 10.

That is, the electroacoustic converter 51 is a speaker that uses the electroacoustic conversion film 10 as an exciter.

In the electroacoustic converter 51, the vibration plate 12 has flexibility as a preferred embodiment. In the present invention, the expression of "having flexibility" is synonymous with having flexibility in the general interpretation, and indicates being capable of bending and being flexible, specifically, being capable of bending and stretching without causing breakage and damage.

The vibration plate 12 is not limited as long as the vibration plate 12 preferably has flexibility and satisfies the relationship with the electroacoustic conversion film 10 (or the laminated piezoelectric element 14 described below) described later, and various sheet-like materials (plate-like materials or films) can be used.

Examples of the vibration plate 12 include resin films formed of polyethylene terephthalate (PET), polypropylene (PP), polystyrene (PS), polycarbonate (PC), polyphenylene sulfide (PPS), polymethylmethacrylate (PMMA), and polyetherimide (PEI), polyimide (PI), polyethylene naphthalate (PEN), triacetyl cellulose (TAC), a cyclic olefin-based resin, or the like, foamed plastic formed of foamed polystyrene, foamed styrene, foamed polyethylene, or the like, and various kinds of corrugated cardboard materials obtained by bonding other paperboards to one or both surfaces of wavy paperboards.

Further, in the electroacoustic converter 51, a display device such as an organic electroluminescence (organic light emitting diode (OLED)) display, a liquid crystal display, a micro light emitting diode (LED) display, and an inorganic electroluminescence display can be suitably used as the vibration plate 12 as long as these have flexibility.

In the electroacoustic converter 51 illustrated in FIG. 6, as a preferred embodiment, the vibration plate 12 and the electroacoustic conversion film 10 are bonded to each other with the bonding layer 16.

Various known layers can be used as the bonding layer 16 as long as the vibration plate 12 and the electroacoustic conversion film 10 can be bonded to each other.

Therefore, the bonding layer 16 may be a layer consisting of an adhesive, which has fluidity during bonding and thereafter enters a solid state, a layer consisting of a pressure sensitive adhesive, which is a gel-like (rubber-like) flexible solid during bonding and does not change in the gel-like state thereafter, or a layer consisting of a material having characteristics of both an adhesive and a pressure sensitive adhesive.

Here, in the electroacoustic converter 51, the electroacoustic conversion film 10 is stretched and contracted to bend and vibrate the vibration plate 12 to generate a sound. Therefore, in the electroacoustic converter 51, it is preferable that the stretching and contracting of the electroacoustic conversion film 10 is directly transmitted to the vibration plate 12. In a case where a substance having a viscosity that relieves vibration is present between the vibration plate 12 and the electroacoustic conversion film 10, the efficiency of transmitting the stretching and contracting energy of the electroacoustic conversion film 10 to the vibration plate 12 is degraded, and the driving efficiency of the electroacoustic converter 51 is also degraded.

In consideration of this point, it is preferable that the bonding layer 16 is an adhesive layer consisting of an adhesive from which a solid and hard bonding layer 16 is obtained, rather than a pressure sensitive adhesive layer consisting of a pressure sensitive adhesive. As a more preferable bonding layer 16, specifically, a bonding layer consisting of a thermoplastic type adhesive such as a polyester-based adhesive or a styrene-butadiene rubber (SBR)-based adhesive is exemplified.

Adhesion, which is different from pressure sensitive adhesion, is useful in a case where a high adhesion temperature is required. Further, the thermoplastic type adhesive has characteristics of "a relatively low temperature, a short time, and strong adhesion", which is suitable.

The thickness of the bonding layer 16 is not limited, and a thickness at which sufficient bonding force (adhesive force or pressure sensitive adhesive force) can be obtained may be appropriately set depending on the material of the bonding layer 16.

Here, in the electroacoustic converter 51, it is preferable that the thickness of the bonding layer 16 decreases because the effect of transmitting the stretching and contracting energy (vibration energy) of the electroacoustic conversion film 10 transmitted to the vibration plate 12 increases and the energy efficiency increases. In addition, in a case where the bonding layer 16 is thick and has high rigidity, there is also a possibility that the stretching and contracting of the electroacoustic conversion film 10 may be constrained.

In consideration of this point, it is preferable that the bonding layer 16 is thin. Specifically, the thickness of the bonding layer 16 is preferably in a range of 0.1 to 50 μm, more preferably in a range of 0.1 to 30 μm, and still more preferably in a range of 0.1 to 10 μm in terms of thickness after bonding.

In the electroacoustic converter 51, the bonding layer 16 is provided as a preferred embodiment and is not an essential constituent element.

Therefore, the electroacoustic converter 51 may fix the vibration plate 12 and the electroacoustic conversion film 10 using a known pressure bonding unit, a fastening unit, a fixing unit, or the like without having the bonding layer 16. For example, in a case where the electroacoustic conversion film 10 is rectangular, the electroacoustic converter may be configured by fastening four corners with members such as bolts and nuts, or the electroacoustic converter may be configured by fastening the four corners and a center portion with members such as bolts and nuts.

However, in this case, in a case where the driving voltage is applied from the power source PS, the electroacoustic conversion film 10 stretches and contracts independently of the vibration plate 12, and in some cases, only the electroacoustic conversion film 10 bends, and the stretching and contracting of the electroacoustic conversion film 10 is not transmitted to the vibration plate 12. As described above, in a case where the electroacoustic conversion film 10 stretches and contracts independently of the vibration plate 12, the vibration efficiency of the vibration plate 12 due to the electroacoustic conversion film 10 degraded, and the vibration plate 12 may not be sufficiently vibrated.

In consideration of this point, it is preferable that the vibration plate 12 and the electroacoustic conversion film 10 are bonded to each other with the bonding layer 16 as illustrated in FIG. 6.

In the electroacoustic converter 51, the power source PS that applies the driving voltage for stretching and contracting the electroacoustic conversion film 10, that is, supplies driving power, is connected to the lower electrode 24 and the upper electrode 26 of each of the electroacoustic conversion films 10.

The power source PS is not limited and may be a direct-current power source or an alternating-current power source. In addition, as for the driving voltage, a driving voltage capable of appropriately driving each of the electroacoustic conversion film 10 may be appropriately set according to the thickness, the forming material, and the like of the piezoelectric layer 20 of each electroacoustic conversion film 10.

A method of leading out an electrode from the lower electrode 24 and the upper electrode 26 is not limited, and various known methods can be used.

As an example, a method of leading out an electrode to the outside by connecting a conductor such as a copper foil to the lower electrode 24 and the upper electrode 26, and a method of leading out an electrode to the outside by forming through-holes in the lower protective layer 28 and the upper protective layer 30 by a laser or the like and filling the through-holes with a conductive material are exemplified.

As a suitable method of leading out an electrode, the method described in JP2014-209724A, the method described in JP2016-015354A, and the like are exemplified.

As described above, the piezoelectric layer 20 contains the piezoelectric particles 36 in the matrix 34. In addition, the lower electrode 24 and the upper electrode 26 are provided so as to sandwich the piezoelectric layer 20 therebetween in the thickness direction.

In a case where a voltage is applied to the lower electrode 24 and the upper electrode 26 of the electroacoustic conversion film 10 having the piezoelectric layer 20, the piezoelectric particles 36 stretch and contract in the polarization direction according to the applied voltage. As a result, the electroacoustic conversion film 10 (piezoelectric layer 20) contracts in the thickness direction. At the same time, the electroacoustic conversion film 10 stretches and contracts in the in-plane direction due to the Poisson's ratio.

The degree of stretch and contraction is approximately in a range of 0.01% to 0.1%.

As described above, the thickness of the piezoelectric layer 20 is preferably approximately 10 to 300 μm. Therefore, the degree of stretch and contraction in the thickness direction is as extremely small as approximately 0.3 μm at the maximum.

On the contrary, the electroacoustic conversion film 10, that is, the piezoelectric layer 20, has a size much larger than the thickness in the plane direction. Therefore, for example, in a case where the length of the electroacoustic conversion film 10 is 20 cm, the electroacoustic conversion film 10 stretches and contracts by a maximum of approximately 0.2 mm by the application of a voltage.

The vibration plate 12 is bonded to the electroacoustic conversion film 10 with the bonding layer 16. Therefore, the stretching and contracting of the electroacoustic conversion film 10 causes the vibration plate 12 to bend, and as a result, the vibration plate 12 vibrates in the thickness direction.

The vibration plate 12 generates a sound due to the vibration in the thickness direction. That is, the vibration plate 12 vibrates according to the magnitude of the voltage (driving voltage) applied to the electroacoustic conversion film 10, and generates a sound according to the driving voltage applied to the electroacoustic conversion film 10.

As described above, a typical electroacoustic conversion film consisting of a polymer material such as PVDF has in-plane anisotropy as a piezoelectric characteristic, and has anisotropy in the amount of stretching and contracting in the plane direction in a case where a voltage is applied.

On the contrary, in the electroacoustic converter 51 illustrated in FIG. 6, the electroacoustic conversion film 10 has no in-plane anisotropy as a piezoelectric characteristic and stretches and contracts isotropically in all directions in the in-plane direction. That is, in the electroacoustic converter 51 illustrated in FIG. 6, the electroacoustic conversion film 10 stretches and contracts isotropically and two-dimensionally.

According to the electroacoustic conversion film 10 that stretches and contracts isotropically and two-dimensionally, compared to a case where typical electroacoustic conversion films formed of PVDF or the like that stretch and contract greatly in only one direction are laminated, the vibration plate 12 can be vibrated with a large force, and a louder and more beautiful sound can be generated.

In FIG. 6, the size of the electroacoustic conversion film 10 in the plane direction is substantially the same as the size of the vibration plate 12 in the plane direction, but the present invention is not limited thereto. For example, the size of the electroacoustic conversion film 10 in the plane direction may be smaller than the size of the vibration plate 12 in the plane direction.

Here, in the electroacoustic converter according to the embodiment of the present invention, the thermal expansion coefficient of the electroacoustic converter is in a range of 12 ppm/° C. to 100 ppm/° C.

Similar to a case of the electroacoustic conversion film described above, it was found that a problem of a decrease in sound pressure occurs in a case where an electroacoustic converter including an electroacoustic conversion film and a vibration plate is used in a high-temperature environment. That is, it was found that the distance between the piezoelectric particles dispersed in the matrix increases due to the expansion of the matrix of the polymer-based piezoelectric composite material in a high-temperature environment, the deformation of the piezoelectric particles is unlikely to be transmitted to the matrix, and thus a problem of degradation of the piezoelectric conversion efficiency occurs even in a case of the electroacoustic converter.

On the contrary, in the electroacoustic converter according to the embodiment of the present invention, expansion of the matrix of the polymer-based piezoelectric composite material in a high-temperature environment is suppressed and the widening of the distance between the piezoelectric particles dispersed in the matrix is suppressed by setting the thermal expansion coefficient of the electroacoustic converter to be in a range of 12 ppm/° C. to 100 ppm/° C. In this manner, the deformation (vibration) of the piezoelectric particles is more suitably transmitted to the matrix, and thus degradation of the piezoelectric conversion efficiency of the electroacoustic converter can be suppressed.

From the viewpoint of more suitably suppressing degradation of the piezoelectric conversion efficiency of the electroacoustic converter in a high-temperature environment and suppressing destruction of the piezoelectric layer, the thermal expansion coefficient of the electroacoustic converter is preferably in a range of 12 ppm/° C. to 100 ppm/° C., more preferably in a range of 16 ppm/° C. to 70 ppm/° C., and still more preferably in a range of 18 ppm/° C. to 55 ppm/° C.

Here, the thermal expansion coefficient of the electroacoustic converter may be measured by cutting out a sample at a position where the electroacoustic conversion film and the vibration plate are laminated according to the same method as that for the electroacoustic conversion film.

As a method of setting the thermal expansion coefficient of the electroacoustic converter to be in the above-described range, a method of using an electroacoustic conversion film having a low thermal expansion coefficient and a vibration plate having a low thermal expansion coefficient may be used.

Specifically, it is preferable to use an electroacoustic conversion film having a thermal expansion coefficient of 12 ppm/° C. to 100 ppm/° C. as the electroacoustic conversion film. That is, it is preferable to use the above-described electroacoustic conversion film according to the embodiment of the present invention.

Further, preferred examples of the vibration plate include vibration plates with a low thermal expansion coefficient such as polyethylene terephthalate (PET), polypropylene (PP), polystyrene (PS), polycarbonate (PC), polyphenylene sulfide (PPS), polymethylmethacrylate (PMMA), polyetherimide (PEI), polyimide (PI), polyethylene terephthalate (PEN), and triacetyl cellulose (TAC).

Further, the thermal expansion coefficient of the vibration plate may be decreased by forming, for example, an inorganic film having a low thermal expansion coefficient such as a silicon oxide film and an aluminum oxide film on the surface of the vibration plate.

Further, a display device such as an organic electroluminescence (organic light emitting diode (OLED)) display, a liquid crystal display, a micro light emitting diode (LED) display, or an inorganic electroluminescence display, which is obtained by using any of these vibration plates as a part of the component, may be used as the vibration plate.

In the electroacoustic converter according to the embodiment of the present invention, the thermal expansion coefficient of the electroacoustic conversion film may be outside the range of 12 ppm/° C. to 100 ppm/° C., but the thermal expansion coefficient of the electroacoustic conversion film is preferable in a range of 12 ppm/° C. to 100 ppm/° C. in order to set the thermal expansion coefficient of the electroacoustic converter to be in the above-described range.

Here, in the electroacoustic converter according to the embodiment of the present invention, an absolute value of a difference between the thermal expansion coefficient of the electroacoustic conversion film and the thermal expansion coefficient of the vibration plate is preferably in a range of 0 ppm/° C. to 80 ppm/° C.

In a case where the absolute value of the difference between the thermal expansion coefficient of the electroacoustic conversion film and the thermal expansion coefficient of the vibration plate (hereinafter, also referred to as the difference in thermal expansion coefficient) is large, a difference in behavior between the thermal expansion of the electroacoustic conversion film and the thermal expansion of the vibration plate occurs, and an internal stress is generated at the interface between the electroacoustic conversion film and the vibration plate, and peeling may occur at the interface. In a case where the electroacoustic conversion film and the vibration plate are peeled off from each other, since the vibration of the electroacoustic conversion film is unlikely to be transmitted to the vibration plate, the acoustic performance (piezoelectric conversion efficiency) may be degraded. Particularly in a case where the difference between the thermal expansion coefficient of the electroacoustic conversion film and the thermal expansion coefficient of the vibration plate is large in a case where the temperature is repeatedly changed, peeling is likely to occur at the interface between the electroacoustic conversion film and the vibration plate.

On the contrary, by setting the difference between the thermal expansion coefficient of the piezoelectric conversion film and the thermal expansion coefficient of the vibration plate to be in a range of 0 ppm/° C. to 80 ppm/° C., the peeling of the electroacoustic conversion film and the vibration plate due to the high-temperature environment or repeated temperature change can be suppressed to suppress degradation of the piezoelectric conversion efficiency.

From the viewpoint of suppressing the peeling of the electroacoustic conversion film and the vibration plate, the difference between the thermal expansion coefficient of the electroacoustic conversion film and the thermal expansion coefficient of the vibration plate is preferably in a range of 0 ppm/° C. to 80 ppm/° C., more preferably in a range of 0 ppm/° C. to 50 ppm/° C., and still more preferably in a range of 0 ppm/° C. to 30 ppm/° C.

The difference between the thermal expansion coefficient of the electroacoustic conversion film and the thermal expansion coefficient of the vibration plate may be acquired by respectively taking out the electroacoustic conversion film and the vibration plate from the electroacoustic converter and measuring each thermal expansion coefficient according to the above-described method.

Further, the loss tangent (Tan δ) of the electroacoustic conversion film in the electroacoustic converter according to the embodiment of the present invention at a frequency of 1 Hz and 60° C. according to dynamic viscoelasticity measurement is preferably 0.03 or greater.

Since the electroacoustic conversion film is viscous in a high-temperature environment by setting the loss tangent (Tan δ) of the electroacoustic conversion film at a frequency of 1 Hz and 60° C. to 0.03 or greater, the stress generated due to the difference between the thermal expansion coefficient of the electroacoustic conversion film and the thermal expansion coefficient of the vibration plate in a high-temperature environment or repeated temperature change is relieved by this viscosity, and thus the peeling of the electroacoustic conversion film and the vibration plate can be suppressed.

From the viewpoint of suppressing the peeling between the electroacoustic conversion film and the vibration plate, the loss tangent (Tan δ) of the electroacoustic conversion film at a frequency of 1 Hz and 60° C. according to the dynamic viscoelasticity measurement is preferably 0.03 or greater, more preferably 0.04 or greater, and still more preferably 0.07 or greater.

The electroacoustic converter 51 illustrated in FIG. 6 is configured to have one sheet of the electroacoustic conversion film 10, but the present invention is not limited thereto.

FIG. 7 conceptually illustrates an example of the electroacoustic converter including the electroacoustic conversion film 10 according to the embodiment of the present invention.

An electroacoustic converter 50 illustrated in FIG. 7 includes the laminated piezoelectric element 14 and the vibration plate 12. The laminated piezoelectric element 14 is formed by laminating a plurality of layers of the electroacoustic conversion films according to the embodiment of the present invention. In the example illustrated in FIG. 7, the laminated piezoelectric element 14 is formed by laminating three layers of the above-described electroacoustic conversion film 10 according to the embodiment of the present invention.

In the electroacoustic converter 50, the laminated piezoelectric element 14 and the vibration plate 12 are bonded to each other by a bonding layer 16.

Power sources PS for applying a driving voltage are connected to the electroacoustic conversion films 10 constituting the laminated piezoelectric element 14 of the electroacoustic converter 50.

Further, since the electroacoustic converter in FIG. 7 has the same configuration as in FIG. 6 except for having the laminated piezoelectric element 14 in place of the electroacoustic conversion film 10, the same members are denoted by the same reference numerals, and the description will be given mainly to different parts.

For simplification of the drawings, the lower protective layer 28 and the upper protective layer 30 are omitted in FIG. 7. However, in the laminated piezoelectric element 14 illustrated in FIG. 7, as a preferred embodiment, all the electroacoustic conversion films 10 have both the lower protective layer 28 and the upper protective layer 30.

However, the laminated piezoelectric element is not limited thereto, and an electroacoustic conversion film having a protective layer and an electroacoustic conversion film having no protective layer may be mixed. Further, in a case where the electroacoustic conversion film has a protective layer, the electroacoustic conversion film may have only the lower protective layer 28 or only the upper protective layer 30. As an example, the laminated piezoelectric element 14 having a three-layer configuration as illustrated in FIG. 7 may have a configuration in which the electroacoustic conversion film which is the uppermost layer in the figure has only the upper protective layer 30, the electroacoustic conversion film which is the middle layer has no protective layer, and the electroacoustic conversion film which is the lowermost layer has only the lower protective layer 28.

From this viewpoint, the same applies to the laminated piezoelectric element 56 illustrated in FIG. 8 and the laminated piezoelectric element 60 illustrated in FIG. 9, which will be described later.

As will be described in detail later, in the electroacoustic converter 50, in a case where the driving voltage is applied to the electroacoustic conversion film 10 of the laminated piezoelectric element 14, the electroacoustic conversion film 10 stretches and contracts in the plane direction, and the laminated piezoelectric element 14 stretches and contracts in the plane direction due to the stretching and contracting of the electroacoustic conversion film 10.

The stretching and contracting of the laminated piezoelectric element 14 in the plane direction causes the vibration plate 12 to bend, and as a result, the vibration plate 12 vibrates in the thickness direction. The vibration plate 12 generates a sound due to the vibration in the thickness direction. The vibration plate 12 vibrates according to the magnitude of the driving voltage applied to the electroacoustic conversion film 10, and generates a sound according to the driving voltage applied to the electroacoustic conversion film 10.

That is, the electroacoustic converter 50 is a speaker that uses the laminated piezoelectric element 14 as an exciter.

In the electroacoustic converter 50 illustrated in FIG. 7, the laminated piezoelectric element 14 has a configuration in which three electroacoustic conversion films 10 are laminated and the adjacent electroacoustic conversion films 10 are bonded to each other with the bonding layer 19. The power sources PS that apply a driving voltage for stretching and contracting the electroacoustic conversion films 10 are respectively connected to the electroacoustic conversion films 10.

Further the laminated piezoelectric element 14 illustrated in FIG. 7 is formed by laminating three electroacoustic conversion films 10, but the present invention is not limited thereto. That is, the number of laminated electroacoustic conversion films 10 may be two layers or four or more layers in a case where the laminated piezoelectric element is formed by laminating a plurality of layers of the electroacoustic conversion films 10. From this viewpoint, the same applies to the laminated piezoelectric element 56 illustrated in FIG. 8 and the laminated piezoelectric element 60 illustrated in FIG. 9, which will be described later.

In the present invention, even in the electroacoustic converter 50 obtained by using the laminated piezoelectric element 14 in which a plurality of electroacoustic conversion films 10 are laminated as described above, the thermal expansion coefficient of the electroacoustic converter is set to be in a range of 12 ppm/° C. to 100 ppm/° C. In this manner, degradation of the piezoelectric conversion efficiency of the electroacoustic converter can be suppressed.

Further, the thermal expansion coefficient of the electroacoustic converter obtained by using the laminated piezoelectric element in which a plurality of electroacoustic conversion films are laminated may be measured by cutting out a sample at a position where the plurality of electroacoustic conversion films (laminated piezoelectric elements) and the vibration plate are laminated according to the same method as that for the electroacoustic conversion film.

As a preferred embodiment, the laminated piezoelectric element 14 illustrated in FIG. 7 has a configuration in which a plurality of layers (three layers in the example illustrated in FIG. 7) of the electroacoustic conversion films 10 are laminated in a state where the polarization directions of the electroacoustic conversion films 10 adjacent to each other are opposite to each other, and the adjacent electroacoustic conversion films 10 are bonded to each other with the bonding layer 19.

As the bonding layer 19, various known layers can be used as long as the adjacent electroacoustic conversion films 10 can be bonded to each other.

Therefore, the bonding layer 19 may be a layer consisting of an adhesive, a layer consisting of a pressure sensitive adhesive, or a layer consisting of a material having characteristics of both an adhesive and a pressure sensitive adhesive, which are described above.

Here, the laminated piezoelectric element 14 vibrates the vibration plate 12 and generates a sound by stretching and contracting the plurality of laminated electroacoustic conversion films 10. Therefore, in the laminated piezoelectric element 14, it is preferable that the stretching and contracting of each electroacoustic conversion film 10 is directly transmitted. In a case where a substance having a viscosity that relieves vibration is present between the electroacoustic conversion films 10, the efficiency of transmitting the stretching and contracting energy of the electroacoustic conversion film 10 is lowered, and the driving efficiency of the laminated piezoelectric element 14 is also degraded.

In consideration of this point, it is preferable that the bonding layer 19 is an adhesive layer consisting of an adhesive from which a solid and hard bonding layer 19 is obtained, rather than a pressure sensitive adhesive layer consisting of a pressure sensitive adhesive. As a more preferable bonding layer 19, specifically, a bonding layer consisting of a thermoplastic type adhesive such as a polyester-based adhesive or a styrene-butadiene rubber (SBR)-based adhesive is suitably exemplified.

Adhesion, which is different from pressure sensitive adhesion, is useful in a case where a high adhesion temperature is required. Further, the thermoplastic type adhesive has characteristics of "a relatively low temperature, a short time, and strong adhesion", which is suitable.

The thickness of the bonding layer 19 is not limited, and a thickness that enables a sufficient bonding force to be exhibited may be appropriately set depending on the material for forming the bonding layer 19.

Here, in the laminated piezoelectric element 14 illustrated in FIG. 7, in a case where the thickness of the bonding layer 19 decreases, the effect of transmitting the stretching and contracting energy of the electroacoustic conversion film 10 may increase, and thus the energy efficiency may increase. In addition, in a case where the bonding layer 19 is thick and has high rigidity, there is also a possibility that the stretching and contracting of the electroacoustic conversion film 10 may be constrained.

In consideration of this point, it is preferable that the bonding layer 19 is thinner than the piezoelectric layer 20. That is, it is preferable that the bonding layer 19 in the laminated piezoelectric element 14 is hard and thin. Specifically, the thickness of the bonding layer 19 is preferably in a range of 0.1 to 50 μm, more preferably in a range of 0.1 to 30 μm, and still more preferably in a range of 0.1 to 10 μm in terms of thickness after the bonding.

Further, as will be described later, in the laminated piezoelectric element 14 illustrated in FIG. 7, since the polarization directions of the adjacent electroacoustic conversion films are opposite to each other and there is no concern that the adjacent electroacoustic conversion films 10 may be short-circuited, the bonding layer 19 can be made thin.

In the laminated piezoelectric element 14 illustrated in FIG. 7, in a case where the spring constant (thickness× Young's modulus) of the bonding layer 19 is high, there is a possibility that the stretching and contracting of the electroacoustic conversion film 10 may be constrained. Therefore, it is preferable that the spring constant of the bonding layer 19 is less than or equal to the spring constant of the electroacoustic conversion film 10.

Specifically, the product of the thickness of the bonding layer 19 and the storage elastic modulus (E') at a frequency of 1 Hz according to the dynamic viscoelasticity measurement is preferably $2.0 \times 10^6$ N/m or less at 0° C. and $1.0 \times 10^6$ N/m or less at 50° C.

It is preferable that the internal loss of the bonding layer at a frequency of 1 Hz according to the dynamic viscoelasticity measurement is 1.0 or less at 25° C. in the case of the bonding layer 19 consisting of a pressure sensitive adhesive, and is 0.1 or less at 25° C. in the case of the bonding layer 19 consisting of an adhesive.

In the laminated piezoelectric element 14 constituting the electroacoustic converter 50, the bonding layer 19 is provided as a preferred embodiment and is not an essential constituent element.

Therefore, in the laminated piezoelectric element constituting the electroacoustic converter, the laminated piezoelectric element may be configured by laminating the electroacoustic conversion films 10 so that the electroacoustic conversion films are in close contact with each other using a known pressure bonding unit, a fastening unit, a fixing unit, or the like without having the bonding layer 19. For example, in a case where the electroacoustic conversion film 10 is rectangular, the laminated piezoelectric element may be configured by fastening four corners with bolts, nuts, and the like or the laminated piezoelectric element may be configured by fastening four corners and a center portion with bolts, nuts, and the like. Alternatively, the laminated piezoelectric element may be configured by laminating the electroacoustic conversion films 10 and thereafter bonding the peripheral portion (end surface) with a pressure sensitive adhesive tape to fix the laminated electroacoustic conversion films 10.

However, in this case, in a case where a driving voltage is applied from the power source PS, the individual electroacoustic conversion films 10 stretch and contract independently, and in some cases, layers of the electroacoustic conversion films 10 bend in opposite directions and form a void. As described above, in a case where the individual electroacoustic conversion films 10 stretch and contract independently, the driving efficiency of the laminated piezoelectric element decreases, the degree of stretching and contracting of the entire laminated piezoelectric element decreases, and there is a possibility that an abutting vibration plate or the like cannot be sufficiently vibrated. In particular, in a case where the layers of the electroacoustic conversion films 10 bend in the opposite directions and form a void, the driving efficiency of the laminated piezoelectric element is greatly decreased.

In consideration of this point, it is preferable that the laminated piezoelectric element has the bonding layer 19 for bonding adjacent electroacoustic conversion films 10 to each other, as in the laminated piezoelectric element 14 illustrated in FIG. 7.

As will be described later, in the laminated piezoelectric element 14, the polarization directions of the adjacent electroacoustic conversion films 10 are opposite to each other. Therefore, in the adjacent electroacoustic conversion films 10, the lower electrodes 24 face each other and the upper electrodes 26 face each other. Therefore, the power source PS constantly supplies power of the same polarity to the facing electrodes regardless of whether the power source PS is an alternating-current power source or a direct-current power source. For example, in the laminated piezoelectric element 14 illustrated in FIG. 7, power of the same polarity is constantly supplied to the upper electrode 26 of the electroacoustic conversion film 10 which is the lowermost layer in the figure and the upper electrode 26 of the electroacoustic conversion film 10 which is the second layer (middle layer), and power of the same polarity is constantly supplied to the lower electrode 24 of the electroacoustic conversion film 10 which is the second layer and the lower electrode 24 of the electroacoustic conversion film 10 which is the uppermost layer in the figure.

As described above, in a case where a voltage is applied to the lower electrode 24 and the upper electrode 26 of the electroacoustic conversion film 10, the piezoelectric particles 36 stretch and contract in the polarization direction according to the applied voltage. As a result, the electroacoustic conversion film 10 (piezoelectric layer 20) contracts in the thickness direction. At the same time, the electroacoustic conversion film 10 stretches and contracts in the in-plane direction due to the Poisson's ratio.

The laminated piezoelectric element 14 is formed by laminating and bonding the electroacoustic conversion films 10. Therefore, in a case where the electroacoustic conversion film 10 stretches and contracts, the laminated piezoelectric element 14 also stretches and contracts.

The vibration plate 12 is bonded to the laminated piezoelectric element 14 by the bonding layer 16. Therefore, the stretching and contracting of the laminated piezoelectric element 14 causes the vibration plate 12 to bend, and as a result, the vibration plate 12 vibrates in the thickness direction.

The vibration plate 12 generates a sound due to the vibration in the thickness direction. That is, the vibration plate 12 vibrates according to the magnitude of the voltage (driving voltage) applied to the electroacoustic conversion film 10, and generates a sound according to the driving voltage applied to the electroacoustic conversion film 10.

The laminated piezoelectric element 14 illustrated in FIG. 7 is obtained by laminating a plurality of the electroacoustic conversion films 10. The laminated piezoelectric element 14 is formed by further bonding the electroacoustic conversion films 10 adjacent to each other with the bonding layer 19 as a preferred embodiment.

Therefore, even in a case where the rigidity of each electroacoustic conversion film 10 is low and the stretching and contracting force thereof is small, the rigidity is increased by laminating the electroacoustic conversion films 10, and the stretching and contracting force as the laminated piezoelectric element 14 is increased. As a result, in the laminated piezoelectric element 14, even in a case where the vibration plate 12 has a certain degree of rigidity, the vibration plate 12 is sufficiently bent with a large force and the vibration plate 12 can be sufficiently vibrated in the thickness direction, whereby the vibration plate 12 can generate a sound.

Further, in a case where the thickness of the piezoelectric layer 20 increases, the stretching and contracting force of the electroacoustic conversion film 10 increases, but the driving voltage required for stretching and contracting the film is increased by the same amount. Here, as described above, in the laminated piezoelectric element 14, since the maximum thickness of the piezoelectric layer 20 is preferably approximately 300 μm, the electroacoustic conversion film 10 can be sufficiently stretched and contracted even in a case where the voltage to be applied to each electroacoustic conversion film 10 is small.

Here, in the electroacoustic converter 50, it is preferable that the product of the thickness of the laminated piezoelectric element 14 and the storage elastic modulus at a frequency of 1 Hz and 25° C. according to the dynamic viscoelasticity measurement is 0.1 to 3 times the product of the thickness of the vibration plate 12 and the Young's modulus thereof.

As described above, the electroacoustic conversion film 10 according to the embodiment of the present invention has satisfactory flexibility, and the laminated piezoelectric element 14 on which the electroacoustic conversion film 10 is laminated also has satisfactory flexibility.

Further, the vibration plate 12 has a certain degree of rigidity. In a case where the laminated piezoelectric element 14 having rigidity is combined with the vibration plate 12, the combination is hard and unlikely to be bent, which is disadvantageous in terms of flexibility of the electroacoustic converter 50.

Meanwhile, in the electroacoustic converter, the product of the thickness of the laminated piezoelectric element 14 and the storage elastic modulus at a frequency of 1 Hz and 25° C. according to the dynamic viscoelasticity measurement is preferably three times or less the product of the thickness of the vibration plate 12 and the Young's modulus thereof. That is, in the laminated piezoelectric element 14, the spring constant with respect to a slow movement is preferably three times or less that of the vibration plate 12.

With this configuration, the electroacoustic converter exhibits a behavior of being flexible with respect to a slow movement due to an external force such as bending and rolling, that is, exhibits satisfactory flexibility with respect to a slow movement.

In the electroacoustic converter, the product of the thickness of the laminated piezoelectric element 14 and the storage elastic modulus at a frequency of 1 Hz and 25° C. according to the dynamic viscoelasticity measurement is more preferably two times or less, still more preferably one time or less, and particularly preferably 0.3 times or less the product of the thickness of the vibration plate 12 and the Young's modulus thereof.

In consideration of the material used for the laminated piezoelectric element 14, a preferable configuration of the laminated piezoelectric element 14, and the like, the product of the thickness of the laminated piezoelectric element 14 and the storage elastic modulus at a frequency of 1 Hz and 25° C. according to the dynamic viscoelasticity measurement is preferably 0.1 times or greater the product of the thickness of the vibration plate 12 and the Young's modulus thereof.

In the electroacoustic converter, the product of the thickness of the laminated piezoelectric element 14 and the storage elastic modulus at a frequency of 1 kHz and 25° C. in the master curve obtained from the dynamic viscoelasticity measurement is preferably in a range of 0.3 to 10 times the product of the thickness of the vibration plate 12 and the Young's modulus thereof. That is, in the laminated piezoelectric element 14, the spring constant for a fast movement in a driven state is preferably in a range of 0.3 to 10 times that of the vibration plate 12.

As described above, the electroacoustic converter generates a sound by stretching and contracting the laminated piezoelectric element 14 in the plane direction to vibrate the vibration plate 12. Therefore, it is preferable that the laminated piezoelectric element 14 has a certain degree of rigidity (hardness, stiffness) with respect to the vibration plate 12 at a frequency of the audio band (20 Hz to 20 kHz).

In the electroacoustic converter, the product of the thickness of the laminated piezoelectric element 14 and the storage elastic modulus at a frequency of 1 kHz and 25° C. in the master curve obtained from the dynamic viscoelasticity measurement is set to preferably 0.3 times or greater, more preferably 0.5 times or greater, and still more preferably 1 time or greater the product of the thickness of the vibration plate 12 and the Young's modulus thereof. That is, in the laminated piezoelectric element 14, the spring constant with respect to a fast movement is preferably 0.3 times or greater, more preferably 0.5 times or greater, and still more preferably 1 time or greater that of the vibration plate 12.

In this manner, at a frequency of the audio band, the rigidity of the laminated piezoelectric element 14 with respect to the vibration plate 12 is sufficiently ensured, and the electroacoustic converter can output a sound with a high sound pressure and high energy efficiency.

Meanwhile, in consideration of the materials available for the laminated piezoelectric element 14, a preferable configuration of the laminated piezoelectric element 14, and the like, the product of the thickness of the laminated piezoelectric element 14 and the storage elastic modulus at a frequency of 1 kHz and 25° C. according to the dynamic viscoelasticity measurement is preferably 10 times or less the product of the thickness of the vibration plate 12 and the Young's modulus thereof.

In regard to the product of the thickness and the storage elastic modulus described above, the same applies to a case where the electroacoustic converter is configured by using the electroacoustic conversion film 10 instead of the laminated piezoelectric element 14 (in a case where a configuration as in FIG. 6 is employed).

In the electroacoustic converter 50 illustrated in FIG. 7, as a preferred embodiment, the polarization directions of the piezoelectric layers 20 of the adjacent electroacoustic conversion films 10 in the laminated piezoelectric element 14 are opposite to each other as described above.

In the electroacoustic conversion film 10, the polarity of the voltage applied to the piezoelectric layer 20 depends on the polarization direction. Therefore, in regard to the polarity of the voltage to be applied, the polarity of the electrode on the side in a direction in which the arrows are directed (the downstream side of the arrows) and the polarity of the electrode on the opposite side (the upstream side of the arrows) are coincident with each other in all the electroacoustic conversion films 10 in the polarization directions indicated by the arrows in FIG. 7.

In the example illustrated in FIG. 7, the electrode on the side in the direction in which the arrows indicating the polarization direction are directed is defined as the lower electrode 24, the electrode on the opposite side is defined as the upper electrode 26, and the polarities of the upper electrode 26 and the lower electrode 24 are the same in all the electroacoustic conversion films 10.

Therefore, in the laminated piezoelectric element 14 in which the polarization directions of the piezoelectric layers 20 of the adjacent electroacoustic conversion films 10 are opposite to each other, the upper electrodes 26 face each other on one surface and the lower electrodes face each other on the other surface in the adjacent electroacoustic conversion films 10. Therefore, in the laminated piezoelectric element 14, even in a case where the electrodes of the adjacent electroacoustic conversion films 10 come into contact with each other, there is no risk of a short circuit.

As described above, in order to stretch and contract the laminated piezoelectric element 14 with satisfactory energy efficiency, it is preferable that the thickness of the bonding layer 19 is decreased so that the bonding layer 19 does not interfere with the stretching and contracting of the piezoelectric layer 20.

On the contrary, in the laminated piezoelectric element 14 illustrated in FIG. 7 in which there is no risk of a short circuit even in a case where the electrodes of the adjacent electroacoustic conversion films 10 come into contact with each other, the bonding layer 19 may be omitted. In addition, even in a case where the bonding layer 19 is provided as a preferred embodiment, the bonding layer 19 can be made extremely thin as long as a required bonding force can be obtained.

Therefore, the laminated piezoelectric element 14 can be stretched and contracted with high energy efficiency.

As described above, in the electroacoustic conversion film 10, the absolute amount of stretching and contracting of the piezoelectric layer 20 in the thickness direction is extremely small, and the stretching and contracting of the electroacoustic conversion film 10 are made substantially only in the plane direction.

Therefore, even in a case where the polarization directions of the electroacoustic conversion films 10 to be laminated are opposite to each other, all the electroacoustic conversion films 10 stretch and contract in the same direction as long as the polarities of the voltages applied to the lower electrode 24 and the upper electrode 26 are correct.

In the laminated piezoelectric element 14, the polarization direction of the electroacoustic conversion film 10 may be detected by a d33 meter or the like.

Alternatively, the polarization direction of the electroacoustic conversion film 10 may be known from the treatment conditions for the polarization described above.

In the laminated piezoelectric element 14 illustrated in FIG. 7, it is preferable that a long (large-area) electroacoustic conversion film is prepared, and the long electroacoustic conversion film is cut into individual electroacoustic conversion film 10 as described above. Therefore, in this case, the plurality of electroacoustic conversion films 10 constituting the laminated piezoelectric element 14 are all the same.

However, the present invention is not limited thereto. That is, the piezoelectric laminate in the electroacoustic converter may have any of various configurations such as a configuration in which electroacoustic conversion films having different layer configurations, such as an electroacoustic conversion film having the lower protective layer 28 and the upper protective layer 30 and an electroacoustic conversion film having no lower protective layer and no upper protective layer, are laminated, a configuration in which electroacoustic conversion films in which the thicknesses of the piezoelectric layers 20 are different from each other are laminated, and the like.

In the electroacoustic converter 50 illustrated in FIG. 7, the laminated piezoelectric element 14 is formed by laminating a plurality of electroacoustic conversion films 10 in a state where the polarization directions of the electroacoustic conversion films adjacent to each other are opposite to each other and bonding the adjacent electroacoustic conversion films 10 with the bonding layer 19, as a preferred embodiment.

The laminated piezoelectric element according to the embodiment of the present invention is not limited thereto, and various configurations can be used.

Figure 8:
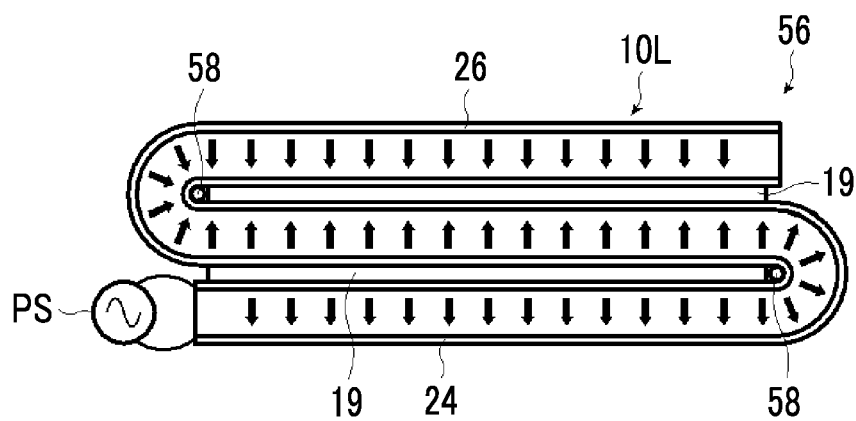
FIG. 8 is a conceptual view illustrating another example of a laminated piezoelectric element.

FIG. 8 illustrates an example thereof. Since the laminated piezoelectric element 56 illustrated in FIG. 8 uses a plurality of the same members as those of the laminated piezoelectric element 14 described above, the same members are denoted by the same reference numerals, and the description will be given mainly to different parts.

The laminated piezoelectric element 56 illustrated in FIG. 8 is a more preferred embodiment of the laminated piezoelectric element of the present invention, a long electroacoustic conversion film 10L is folded back, for example, once or more, or preferably a plurality of times in the longitudinal direction so that a plurality of layers of the electroacoustic conversion film 10L are laminated. In addition, similarly to the laminated piezoelectric element 14 illustrated in FIG. 7 and the like described above, in the laminated piezoelectric element 56 illustrated in FIG. 8, as a preferred embodiment, the electroacoustic conversion film 10L laminated by folding-back is bonded with the bonding layer 19.

By folding back and laminating one sheet of the long electroacoustic conversion film 10L polarized in the thickness direction, the polarization directions of the electroacoustic conversion film 10L adjacent (facing) in the lamination direction are opposite directions as indicated by the arrows in FIG. 8.

According to this configuration, the laminated piezoelectric element 56 can be configured with only one long electroacoustic conversion film 10L, only one power source PS for applying the driving voltage is required, and an electrode may be led out from the electroacoustic conversion film 10L at one place.

Therefore, according to the laminated piezoelectric element 56 illustrated in FIG. 8, the number of components can be reduced, the configuration can be simplified, the reliability of the piezoelectric element (module) can be improved, and a further reduction in cost can be achieved.

Similar to the laminated piezoelectric element 56 illustrated in FIG. 8, in the laminated piezoelectric element 56 in which the long electroacoustic conversion film 10L is folded back, it is preferable that a core rod 58 is brought into contact with the electroacoustic conversion film 10L and inserted into the folded-back portion of the electroacoustic conversion film 10L.

As described above, the lower electrode 24 and the upper electrode 26 of the electroacoustic conversion film 10L are formed of a metal vapor deposition film or the like. In a case where the metal vapor deposition film is bent at an acute angle, cracks and the like are likely to occur, and thus the electrode may be broken. That is, in the laminated piezoelectric element 56 illustrated in FIG. 8, cracks and the like are likely to occur in the electrodes inside the bent portion.

On the contrary, in the laminated piezoelectric element 56 in which the long electroacoustic conversion film 10L is folded back, by inserting the core rod 58 into the folded-back portion of the electroacoustic conversion film 10L, the lower electrode 24 and the upper electrode 26 are prevented from being bent. Therefore, the occurrence of breakage can be suitably prevented.

In the electroacoustic converter according to the embodiment of the present invention, the laminated piezoelectric element may use the bonding layer 19 having conductivity. In particular, in the laminated piezoelectric element 56 in which one sheet of the long electroacoustic conversion film 10L is folded back and laminated as illustrated in FIG. 8, the bonding layer 19 having conductivity is preferably used.

In the laminated piezoelectric element in which the polarization directions of the adjacent electroacoustic conversion films 10 are opposite to each other as illustrated in FIGS. 7 and 8, in the electroacoustic conversion films 10 to be laminated, electric power having the same polarity is supplied to the facing electrodes. Therefore, a short circuit does not occur between the facing electrodes.

Meanwhile, as described above, in the laminated piezoelectric element 56 in which the electroacoustic conversion film 10L is folded back and laminated, the electrode is likely to be broken inside the bent portion that is folded back at an acute angle.

Therefore, by bonding the laminated electroacoustic conversion film 10L with the bonding layer 19 having conductivity, since electrical conduction can be ensured by the bonding layer 19 even in a case where the electrode is broken inside the bent portion, breakage is prevented and the reliability of the laminated piezoelectric element 56 can be greatly improved.

Here, the electroacoustic conversion film 10L forming the laminated piezoelectric element 56 has the lower protective layer 28 and the upper protective layer 30 preferably in a manner that the lower electrode 24 and the upper electrode 26 face each other and interpose the laminate therebetween as illustrated in FIG. 1.

In this case, even in a case where the bonding layer 19 having conductivity is used, the conductivity cannot be secured. Therefore, in a case where the electroacoustic conversion film 10L has a protective layer, through-holes may be provided in the lower protective layer 28 and the upper protective layer 30 in regions where the lower electrodes 24 face each other and the upper electrodes 26 face each other in the laminated electroacoustic conversion film 10L, and the bonding layer 19 having conductivity may be brought into contact with the lower electrode 24 and the upper electrode 26. Preferably, the through-holes formed in the lower protective layer 28 and the upper protective layer 30 are closed with a silver paste or a conductive bonding agent, and the adjacent electroacoustic conversion film 10L is bonded thereto with the bonding layer 19 having conductivity.

In this case, the through-holes of the lower protective layer 28 and the upper protective layer 30 may be formed by removal of the protective layers through laser processing, solvent etching, mechanical polishing, or the like.

The number of through-holes of the lower protective layer 28 and the upper protective layer 30 may be one or more in the regions where the lower electrodes 24 face each other and the upper electrodes 26 face each other in the laminated electroacoustic conversion film 10L, preferably outside the bent portion of the electroacoustic conversion film 10L. Alternatively, the through-holes of the lower protective layer 28 and the upper protective layer 30 may be formed regularly or irregularly on the entire surface of the lower protective layer 28 and the upper protective layer 30.

The bonding layer 19 having conductivity is not limited, and various known bonding layers can be used.

In the above-described laminated piezoelectric element, the polarization directions of the laminated electroacoustic conversion films 10 are opposite to each other in the adjacent electroacoustic conversion films 10, but the present invention is not limited thereto.

That is, in the present invention, in the laminated piezoelectric element on which the electroacoustic conversion films 10 are laminated, the polarization directions of the piezoelectric layers 20 may be all the same as in the laminated piezoelectric element 60 illustrated in FIG. 9.

As illustrated in FIG. 9, in the laminated piezoelectric element 60 in which the polarization directions of the electroacoustic conversion films 10 to be laminated are all the same, the lower electrode 24 and the upper electrode 26 face each other between the adjacent electroacoustic conversion films 10. Therefore, in a case where the bonding layer 19 is not sufficiently thick, the lower electrodes 24 and the upper electrodes 26 of the adjacent electroacoustic conversion films 10 may come into contact with each other at the outer end portion of the bonding layer 19 in the plane direction, and there is a risk of a short circuit.

Therefore, as illustrated in FIG. 9, in the laminated piezoelectric element 60 in which the polarization directions of the electroacoustic conversion films 10 to be laminated are all the same, the bonding layer 19 cannot be made thin, and the energy efficiency is inferior to that of the laminated piezoelectric elements illustrated in FIGS. 7 and 8.

Hereinbefore, the electroacoustic conversion film and the electroacoustic converter according to the embodiment of the present invention have been described in detail, but the present invention is not limited to the above-described examples, and various improvements or modifications may be made within a range not departing from the scope of the present invention.

EXAMPLES

Hereinafter, the present invention will be described in more detail with reference to specific examples of the present invention.

Example 1-1

<Preparation of Coating Material>

First, cyanoethylated PVA (CR-V, manufactured by Shin-Etsu Chemical Co., Ltd.) was dissolved in dimethylformamide (DMF) at the following compositional ratio. Thereafter, PZT particles were added to the solution at the following compositional ratio and dispersed using a propeller mixer (rotation speed of 2000 rpm), thereby preparing a coating material for forming a piezoelectric layer.
(Coating Material)
 PZT particles: 300 parts by mass
 Cyanoethylated PVA: 10 parts by mass
 DMF: 70 parts by mass In addition, PZT particles obtained by sintering commercially available PZT raw material powder at 1000° C. to 1200° C. and thereafter crushing and classifying the sintered powder to have an average particle diameter of 5 μm were used as the PZT particles.

<Application of Coating Material>

Further, a sheet-like material obtained by performing vacuum vapor deposition on a copper thin film having a thickness of 0.1 μm on a PET film having a thickness of 4 μm was prepared. That is, in the present example, the thin film electrode is a copper-deposited thin film having a thickness of 0.1 m, and the protective layer is a PET film having a thickness of 4 μm.

The coating material for forming the piezoelectric layer prepared in advance was applied onto the thin film electrode (copper vapor deposition thin film) of the sheet-like material using a slide coater. Further, the coating material was applied such that the film thickness of the coating film after being dried reached 40 μm.

<Drying Coating Material>

Next, a material obtained by coating the sheet-like material with the coating material was heated and dried on a hot plate at 100° C. to evaporate DMF. In this manner, a laminate in which the thin film electrode made of copper was provided on the protective layer made of PET and the piezoelectric layer (polymer-based piezoelectric composite material) having a thickness of 40 μm was formed thereon was prepared.

<Polarization Treatment>

Next, the piezoelectric layer of the laminate was subjected to a polarization treatment.

<Lamination of Sheet-Like Material>

The sheet-like material was laminated on the laminate which had been subjected to the polarization treatment in a state where the thin film electrode (copper thin film side) was directed toward the piezoelectric layer. Next, in the laminate of the laminate and the sheet-like material, the piezoelectric layer and the thin film electrode were subjected to thermal compression bonding at 120° C. using a laminator device.

<Aging Treatment>

Next, the laminate after the thermal compression bonding was subjected to a heat treatment at 75° C. for 72 hours.

An electroacoustic conversion film was prepared by performing the above-described steps.

<Measurement of Thermal Expansion Coefficient of Electroacoustic Conversion Film>

Thermomechanical characteristics were measured using a thermomechanical analyzer (TMA4000SE, manufactured by NETZSCH Japan K. K.). The sample size was set to 5 mm×20 mm, the distance between chucks was set to 15 mm, and the lengths of both the upper chuck and the lower chuck were set to 2.5±0.5 mm.

After mounting of the sample, the temperature was changed in a range of −20° C. to 60° C. at 5° C./min, and the amount of displacement of the distance between chucks was measured. Further, the measurement was performed by applying a constant load of 3 g to the sample as the load.

Subsequently, the inclination of the approximate straight line of the data related to the amount of displacement in a temperature range of −20° C. to 60° C. was acquired, and the amount of displacement per 1° C. change in temperature was acquired. Further, the thermal expansion coefficient was calculated by dividing the inclination by 15 mm, which was the distance between chucks during the setting of the sample.

As a result of the measurement, the thermal expansion coefficient thereof was 12 ppm/° C.

Example 1-2

An electroacoustic conversion film was prepared in the same manner as in Example 1-1 except that the compositional ratio of the coating material forming the piezoelectric layer was set as follows.
(Coating Material)
PZT particles: 300 parts by mass
Cyanoethylated PVA: 15 parts by mass
DMF: 70 parts by mass Example 1-3

An electroacoustic conversion film was prepared in the same manner as in Example 1-1 except that the compositional ratio of the coating material forming the piezoelectric layer was set as follows.
(Coating Material)
PZT particles: 300 parts by mass
Cyanoethylated PVA: 30 parts by mass
DMF: 70 parts by mass Example 1-4

An electroacoustic conversion film was prepared in the same manner as in Example 1-3 except that the conditions for the aging treatment performed on the laminate after the thermalcompression bonding were changed to a heat treatment at 65° C. for 72 hours.

Example 1-5

An electroacoustic conversion film was prepared in the same manner as in Example 1-3 except that the conditions for the aging treatment performed on the laminate after the thermal compression bonding were changed to a heat treatment at 55° C. for 72 hours.

Comparative Example 1-1

An electroacoustic conversion film was prepared in the same manner as in Example 1-1 except that the compositional ratio of the coating material forming the piezoelectric layer was set as follows.
(Coating Material)
PZT particles: 300 parts by mass
Cyanoethylated PVA: 5 parts by mass
DMF: 70 parts by mass Comparative Example 1-2

An electroacoustic conversion film was prepared in the same manner as in Example 1-3 except that the laminate after the thermal compression bonding was not subjected to the aging treatment.
[Evaluation]
The change in sound pressure due to the temperature of the prepared electroacoustic conversion film was evaluated in the following manner.
First, a circular test piece having a diameter of 150 mm was cut out from the prepared electroacoustic conversion film. The test piece was fixed to cover the opening surface of a plastic round case having an inner diameter of 138 mm and a depth of 9 mm, and the pressure inside the case was maintained at 1.02 atm. In this manner, the conversion film was bent into a convex shape like a contact lens to form a piezoelectric speaker.

The prepared piezoelectric speaker was allowed to stand in an environment of 25° C. for 24 hours. Thereafter, the sound pressure level frequency characteristics of the piezoelectric speaker at 25° C. were measured in a range of 50 Hz to 20 kHz by sine wave sweep measurement using a constant current type power amplifier, thereby acquiring a sound pressure of 1 kHz. Further, the measurement microphone was disposed at a position directly above by of 10 cm at the center of the piezoelectric speaker.

Next, the piezoelectric speaker was allowed to stand in an environment of 60° C. for 24 hours. Next, the sound pressure level frequency characteristics of the piezoelectric speaker were measured in an environment of 60° C. in the same manner as described above, thereby acquiring a sound pressure of 1 kHz.

A difference between the sound pressure in an environment of 25° C. and the sound pressure in an environment of 60° C. acquired in the above-described manner was calculated. It is evaluated as acceptable in a case where the difference in sound pressure was less than 5 dB and evaluated as unacceptable in a case where the difference in sound pressure is 5 dB or greater.

The results are listed in Table 1.

TABLE 1

| Electroacoustic conversion film | Evaluation | | |
|---|---|---|---|
| | Sound pressure | | Difference |
| Thermal expansion coefficient ppm/° C. | 25° C. dB | 60° C. dB | in sound pressure dB |
| Example 1-1 | 12 | 83.1 | 80 | 3.1 |
| Example 1-2 | 20 | 85 | 84.1 | 0.9 |
| Example 1-3 | 51 | 84.3 | 83.2 | 1.1 |
| Example 1-4 | 70 | 82.9 | 80.9 | 2 |
| Example 1-5 | 99 | 83.5 | 80.4 | 3.1 |
| Comparative Example 1-1 | 6 | 74.2 | 65 | 9.2 |
| Comparative Example 1-2 | 107 | 83.6 | 76.7 | 6.9 |

As listed in Table 1, it was found that the difference between the sound pressure in an environment of 25° C. and the sound pressure in an environment of 60° C. in Examples 1-1 to 1-5 of the present invention was smaller than that of each comparative example. That is, it was found that the electroacoustic conversion film according to the embodiment of the present invention was capable of suppressing degradation of the piezoelectric conversion efficiency in a high-temperature environment.

In Comparative Example 1-1, the piezoelectric layer was brittle and damaged due to the expansion of the voids in the piezoelectric layer in a high-temperature environment, and thus the sound pressure was significantly decreased.

Further, in Comparative Example 1-2, the gap between the piezoelectric particles in the piezoelectric layer was widened in a high-temperature environment, and thus the sound pressure was decreased.

Further, based on the comparison of Examples 1-1 to 1-5, it was found that the thermal expansion coefficient of the electroacoustic conversion film was preferably in a range of 16 ppm/° C. to 70 ppm/° C.

Example 2-1

A sheet in which a 30 µm silicon oxide film was vapor-deposited on both surfaces of a PET film having a thickness of 200 µm was cut into an A4 size and prepared as a vibration plate.

The electroacoustic conversion film prepared in Example 2 was cut into a size of 5 cm×10 cm, a double-sided tape having a thickness of 10 µm was attached to the entire one surface side, and the film was attached to the central portion of an A4-sized vibration plate. Next, both short sides of the A4-sized vibration plate were fixed to a plastic rod to prepare an electroacoustic converter.

<Measurement of Thermal Expansion Coefficient of Electroacoustic Converter>

Thermomechanical characteristics were measured using a thermomechanical analyzer (TMA4000SE, manufactured by NETZSCH Japan K. K.). The sample size was set to 5 mm×20 mm, and a portion having the same area of the electroacoustic conversion film and the vibration plate after being bonded to each other was cut out to have the above-described size. The distance between the chucks was set to 15 mm, and the lengths of both the upper chuck and the lower chuck were set to 2.5±0.5 mm.

Next, the temperature was changed in a range of −20° C. to 60° C. at 5° C./min, and the amount of displacement of the distance between chucks was measured. Further, the measurement was performed by applying a constant load of 3 g to the sample as the load.

Subsequently, the inclination of the approximate straight line of the data related to the amount of displacement in a temperature range of −20° C. to 60° C. was acquired, and the amount of displacement per 1° C. change in temperature was acquired. Further, the thermal expansion coefficient was calculated by dividing the inclination by 15 mm, which was the distance between chucks during the setting of the sample.

As a result of the measurement, the thermal expansion coefficient thereof was 21 ppm/° C.

<Measurement of Difference in Thermal Expansion Coefficient Between Electroacoustic Conversion Film and Vibration Plate>

The vibration plate was scraped off from the prepared electroacoustic converter as follows, and the electroacoustic conversion film was taken out and cut into a sample size of 5 mm×20 mm.

In order to scrape off the vibration plate from the electroacoustic converter, the thickness of only the vibration plate portion in the surface of the electroacoustic converter was first measured by MINICOM (manufactured by Tokyo Semitsu Co., Ltd.). The measurement position in the plane was evenly divided into 10 sections such that the area of only the vibration plate portion was identical within a range of ±10% on average, the thickness was measured at random positions by n=5 times in each section, and the thicknesses of 50 points of "10 sections×n=5" were averaged, thereby acquiring the representative thickness of the vibration plate. Next, the thickness of the electroacoustic converter at the portion to which the electroacoustic conversion film was attached was measured (n=5 points) at intervals of 5 mm or longer, and the average thickness of the electroacoustic converter was acquired.

Next, the electroacoustic converter was fixed onto the milling machine using a FIX FILM (manufactured by Fujicopian Co., Ltd.). Next, the vibration plate was cut with a milling machine, and the electroacoustic conversion film from which the vibration plate having an area of 20 mm×60 mm was removed was taken out. The confirmation of whether the vibration plate was removed from the electroacoustic converter and the electroacoustic conversion film was able to be taken out was carried out based on whether the thickness of the layer including the electroacoustic conversion film remaining after the milling was in a range of ("thickness of electroacoustic converter acquired above"-"thickness of vibration plate acquired above")±5 µm. The thickness of the layer including the remaining electroacoustic conversion film was measured (n=5 points) at in-plane intervals of 5 mm or longer to obtain an average thickness. In a case where the thickness of the electroacoustic conversion film here is in the range defined above, a trace amount of residues of the vibration plate and the double-sided tape for adhering the vibration plate and the electroacoustic conversion film may remain.

As the vibration plate, the vibration plate in a portion to which the electroacoustic conversion film was not bonded and within 4 cm in the vicinity of the adhesive portion of the electroacoustic conversion film was cut into a sample size of 5 mm×20 mm.

By measuring the thermomechanical characteristics of these samples using the same thermomechanical analyzer (TMA) as described above, the thermal expansion coefficient of each sample was acquired, and an absolute value of a difference in thermal expansion coefficient between the electroacoustic conversion film and the vibration plate was acquired.

As a result of the measurement, the difference in the thermal expansion coefficient between the electroacoustic conversion film and the vibration plate was 0 ppm/° C.

<Measurement of Dynamic Viscoelastic Characteristics of Electroacoustic Conversion Film>

The vibration plate was scraped off from the prepared electroacoustic converter as follows, and the electroacoustic conversion film was taken out.

In order to scrape off the vibration plate from the electroacoustic converter, the thickness of only the vibration plate portion in the surface of the electroacoustic converter was first measured by MINICOM (manufactured by Tokyo Semitsu Co., Ltd.). The measurement position in the plane was evenly divided into 10 sections such that the area of only the vibration plate portion was identical within a range of ±10% on average, the thickness was measured at random positions by n=5 times in each section, and the thicknesses of 50 points of "10 sections×n=5" were averaged, thereby acquiring the representative thickness of the vibration plate. Next, the thickness of the electroacoustic converter at the portion to which the electroacoustic conversion film was attached was measured (n=5 points) at intervals of 5 mm or longer, and the average thickness of the electroacoustic converter was acquired.

Next, the electroacoustic converter was fixed onto the milling machine using a FIX FILM (manufactured by Fujicopian Co., Ltd.). Next, the vibration plate was cut with a milling machine, and the electroacoustic conversion film from which the vibration plate having an area of 20 mm×60 mm was removed was taken out. The confirmation of whether the vibration plate was removed from the electroacoustic converter and the electroacoustic conversion film was able to be taken out was carried out based on whether the thickness of the layer including the electroacoustic conversion film remaining after the milling was in a range of ("thickness of electroacoustic converter acquired above"-"thickness of vibration plate acquired above")±5 µm. The thickness of the layer including the remaining electroacoustic conversion film was measured (n=5 points) at in-plane intervals of 5 mm or longer to obtain an average thickness. In a case where the thickness of the electroacoustic conversion film here is in the range defined above, a trace amount of residues of the vibration plate and the double-sided tape for adhering the vibration plate and the electroacoustic conversion film may remain.

The dynamic viscoelasticity was measured using a dynamic viscoelasticity measuring device (DMS6100 viscoelastic spectrometer, manufactured by SII Nanotechnology Inc.). The dynamic viscoelasticity (loss tangent of Tan δ) of the sample was measured by setting the sample area to 10 mm×40 mm under the measurement conditions of a measurement temperature range of −20° C. to 100° C., a temperature rising rate of 2° C./min, a measurement frequency of 1.0 Hz, a measurement mode of tensile measurement.

As shown in the measurement results, the loss tangent (Tan δ) of the electroacoustic conversion film at a frequency of 1 Hz and 60° C. was 0.04.

Example 2-2

An electroacoustic converter was prepared in the same manner as in Example 2-1 except that the electroacoustic conversion film prepared in Example 1-3 was used.

Example 2-3

An electroacoustic converter was prepared in the same manner as in Example 2-1 except that the electroacoustic conversion film prepared in Example 1-5 was used.

Example 2-4

An electroacoustic converter was prepared in the same manner as in Example 2-1 except that a PET film having a thickness of 300 μm was used as the vibration plate. Further, the vibration plate is a PET film that does not have a silicon oxide film.

Example 2-5

An electroacoustic converter was prepared in the same manner as in Example 2-4 except that the electroacoustic conversion film prepared in Example 1-3 was used.

Example 2-6

An electroacoustic converter was produced in the same manner as in Example 2-4 except that the electroacoustic conversion film produced in Example 1-5 was used.

Example 2-7

An electroacoustic converter was prepared in the same manner as in Example 2-1 except that a polycarbonate film having a thickness of 300 μm was used as the vibration plate.

Example 2-8

An electroacoustic converter was prepared in the same manner as in Example 2-7 except that the electroacoustic conversion film prepared in Example 1-3 was used.

Example 2-9

An electroacoustic converter was prepared in the same manner as in Example 2-7 except that the electroacoustic conversion film prepared in Example 1-5 was used.

Example 2-10

An electroacoustic converter was prepared in the same manner as in Example 2-9 except that cyanoethylated pullulan (manufactured by Shin-Etsu Chemical Co., Ltd.) was used in place of the cyanoethylated PVA and the electroacoustic conversion film prepared in Example 1-5 was used.

Example 2-11

An electroacoustic converter was prepared in the same manner as in Example 2-1 except that a polyethylene film having a thickness of 300 μm was used as the vibration plate.

Comparative Example 2-1

An electroacoustic converter was prepared in the same manner as in Example 2-1 except that the electroacoustic conversion film prepared in Comparative Example 1-1 was used and a 100 μm PET film having both surfaces on which a silicon oxide film having a thickness of 50 μm was vapor-deposited was used as the vibration plate.

Comparative Example 2-2

An electroacoustic converter was prepared in the same manner as in Example 2-11 except that the electroacoustic conversion film prepared in Example 1-1 was used.

Comparative Example 2-2

An electroacoustic converter was prepared in the same manner as in Comparative Example 2-2 except that cyanoethylated pullulan (manufactured by Shin-Etsu Chemical Co., Ltd.) was used in place of the cyanoethylated PVA and the electroacoustic conversion film prepared in the same manner as in Comparative Example 1-1 was used.

[Evaluation]
<Change in Sound Pressure in High Temperature Environment>

The change in sound pressure due to the temperature of the prepared electroacoustic converter was evaluated as follows.

The prepared electroacoustic converter was allowed to stand in an environment of 25° C. for 24 hours. Thereafter, the sound pressure level frequency characteristics of the electroacoustic converter were measured in a range of 50 Hz to 20 kHz at 25° C. by sine wave sweep measurement using a constant current type power amplifier, thereby acquiring a sound pressure of 1 kHz. Further, the measurement microphone was disposed at a position directly above by 10 cm at the center to which the electroacoustic conversion film was attached.

Next, the electroacoustic converter was allowed to stand in an environment of 60° C. for 24 hours. Next, the sound pressure level frequency characteristics of the electroacoustic converter were measured in an environment of 60° C. in the same manner as described above, thereby acquiring a sound pressure of 1 kHz.

A difference between the sound pressure in an environment of 25° C. and the sound pressure in an environment of 60° C. acquired in the above-described manner was calculated. It is evaluated as acceptable in a case where the difference in sound pressure was less than 5 dB and evaluated as unacceptable in a case where the difference in sound pressure is 5 dB or greater.

<Change in Sound Pressure Before and After Temperature Cycle Test>

One temperature cycle test was performed by heating the prepared electroacoustic converter from 25° C. to 60° C. at 5° C./min and cooling the electroacoustic converter from 60° C. to 25° C. at 5° C./min. The temperature cycle test was repeated for 50 consecutive cycles, the electroacoustic converter after the completion of the cycles was allowed to stand in an environment of 25° C. for 24 hours, and the sound pressure at 25° C. was evaluated. According to the method of evaluating the sound pressure, the sound pressure of 1 kHz was acquired from the measurement of the sound pressure level frequency characteristics carried out in the same manner as described above.

Next, the sound pressure at 25° C. before the cycle test was compared with the sound pressure after the cycle test.

The results are listed in Table 2.

Further, based on the comparison of Examples 2-1 to 2-11, it was found that the thermal expansion coefficient of the electroacoustic converter is preferably in a range of 16 ppm/° C. to 70 ppm/° C.

Further, based on the comparison of Examples 2-1 to 2-3, the comparison of Examples 2-4 to 2-6, the comparison of Examples 2-7 to 2-9, the comparison of Examples 2-10 and 2-11, and the like, it was found that a decrease in sound pressure in a high-temperature environment is small and a decrease in sound pressure before and after the temperature cycle test is small as the difference between the thermal expansion coefficient of the electroacoustic conversion film and the thermal expansion coefficient of the vibration plate decreases. Particularly in Example 2-11 in which the difference between the thermal expansion coefficient of the electroacoustic conversion film and the thermal expansion coefficient of the vibration plate was greater than 80 ppm/° C., since the difference in thermal expansion coefficient was large, partial peeling occurred between the electroacoustic conversion film and the vibration plate, and thus the sound pressure was decreased.

TABLE 2

| | Electroacoustic converter | | | | | Evaluation | | | | |
|---|---|---|---|---|---|---|---|---|---|---|
| | Thermal expansion coefficient ppm/° C. | Difference in thermal expansion coefficient ppm/° C. | Vibration plate Thermal expansion coefficient ppm/° C. | Electroacoustic conversion film Thermal expansion coefficient ppm/° C. | tan δ | Sound pressure 25° C. dB | Sound pressure 60° C. dB | Difference in sound pressure 25° C. → 60° C. dB | Sound pressure After cycle test dB | Difference in sound pressure Before and after cycle test dB |
| Example 2-1 | 21 | 0 | 20 | 20 | 0.04 | 79.4 | 78.4 | 1 | 79.4 | 0 |
| Example 2-2 | 40 | 31 | 20 | 51 | 0.15 | 79.5 | 78.3 | 1.2 | 79 | 0.5 |
| Example 2-3 | 65 | 79 | 20 | 99 | 0.09 | 78.9 | 76.5 | 2.4 | 75.5 | 3.4 |
| Example 2-4 | 38 | 32 | 52 | 20 | 0.04 | 79.7 | 79 | 0.7 | 78.8 | 0.9 |
| Example 2-5 | 50 | 1 | 52 | 51 | 0.15 | 78.8 | 76.7 | 2.1 | 78.4 | 0.4 |
| Example 2-6 | 74 | 47 | 52 | 99 | 0.09 | 79 | 76.5 | 2.5 | 76.9 | 2.1 |
| Example 2-7 | 50 | 55 | 75 | 20 | 0.04 | 78.5 | 75.9 | 2.6 | 75.7 | 2.8 |
| Example 2-8 | 50 | 24 | 75 | 51 | 0.15 | 80.1 | 78 | 2.1 | 78.9 | 1.2 |
| Example 2-9 | 91 | 24 | 75 | 99 | 0.09 | 79.3 | 76.3 | 3 | 78.1 | 1.2 |
| Example 2-10 | 91 | 24 | 75 | 99 | 0.02 | 78.8 | 75.7 | 3.1 | 74.5 | 4.3 |
| Example 2-11 | 98 | 170 | 190 | 20 | 0.04 | 78.2 | 74.5 | 3.7 | 66.1 | 12.1 |
| Comparative Example 2-1 | 9 | 4 | 10 | 6 | 0.05 | 68.5 | 58.2 | 10.3 | 53.3 | 15.2 |
| Comparative Example 2-2 | 118 | 83 | 190 | 107 | 0.05 | 78.8 | 72.3 | 6.5 | 72.3 | 6.5 |
| Comparative Example 2-3 | 118 | 83 | 190 | 107 | 0.02 | 78.6 | 71.7 | 6.9 | 69.5 | 9.1 |

As listed in Table 2, it was found that in Examples 2-1 to 2-11 of the present invention, the difference between the sound pressure in an environment of 25° C. and the sound pressure in an environment of 60° C. was smaller than that of each comparative example. That is, it was found that the electroacoustic converter according to the embodiment of the present invention was capable of suppressing degradation of piezoelectric conversion efficiency in a high-temperature environment.

In Comparative Example 2-1, the piezoelectric layer was brittle and damaged due to the expansion of the voids in the piezoelectric layer in a high-temperature environment, and thus the sound pressure was significantly decreased.

Further, in Comparative Examples 2-2 and 2-3, the gap between the piezoelectric particles in the piezoelectric layer was widened in a high-temperature environment, and thus the sound pressure was decreased.

Further, based on the comparison between Examples 2-9 and 2-10, it was found that the loss tangent (Tan δ) of the electroacoustic conversion film at a frequency of 1 Hz and 60° C. is preferably 0.03 or greater.

As described above, the effects of the present invention are apparent.

Suitable use for various usages such as audio equipment including speakers and microphones and pressure-sensitive sensors can be achieved.

EXPLANATION OF REFERENCES

10, 10L: electroacoustic conversion film
10a, 10c: sheet-like material
10b: laminate
12: vibration plate
14, 56, 60: laminated piezoelectric element
16, 19: bonding layer 20: piezoelectric layer
20a: upper surface
24: lower electrode
26: upper electrode
28: lower protective layer
30: upper protective layer
34: matrix
36: piezoelectric particles
43: case
45: piezoelectric speaker
45a: rising portion
46: viscoelastic support
48: frame
50, 51: electroacoustic converter
58: core rod
PS: power source
g: gap

What is claimed is:

1. An electroacoustic conversion film comprising:
a polymer-based piezoelectric composite material which contains piezoelectric particles in a matrix containing a polymer material; and
electrode layers which are formed on both surfaces of the polymer-based piezoelectric composite material,
wherein the electroacoustic conversion film has a thermal expansion coefficient of 12 ppm/° C. to 100 ppm/° C.,
wherein the electroacoustic conversion film has a hygric expansion coefficient in a range of 1 to 30 ppm/% RH at 25° C. and in a range of 3 to 40 ppm/% RH at 60° C.

2. The electroacoustic conversion film according to claim 1, further comprising:
a protective layer laminated on a surface of the electrode layer on a side opposite to a surface provided with the polymer-based piezoelectric composite material.

3. The electroacoustic conversion film according to claim 1,
wherein the polymer-based piezoelectric composite material is polarized in a thickness direction.

4. The electroacoustic conversion film according to claim 1,
wherein the polymer-based piezoelectric composite material does not have in-plane anisotropy as a piezoelectric characteristic.

5. The electroacoustic conversion film according to claim 1,
wherein the polymer material has viscoelasticity at room temperature.

6. The electroacoustic conversion film according to claim 2,
wherein the polymer-based piezoelectric composite material is polarized in a thickness direction.

7. The electroacoustic conversion film according to claim 2,
wherein the polymer-based piezoelectric composite material does not have in-plane anisotropy as a piezoelectric characteristic.

8. The electroacoustic conversion film according to claim 2,
wherein the polymer material has viscoelasticity at room temperature.

9. The electroacoustic conversion film according to claim 3,
wherein the polymer-based piezoelectric composite material does not have in-plane anisotropy as a piezoelectric characteristic.

10. The electroacoustic conversion film according to claim 3,
wherein the polymer material has viscoelasticity at room temperature.

11. An electroacoustic converter comprising:
an electroacoustic conversion film which includes a polymer-based piezoelectric composite material containing piezoelectric particles in a matrix containing a polymer material and electrode layers which are formed on both surfaces of the polymer-based piezoelectric composite material; and
a vibration plate which is laminated on the electroacoustic conversion film,
wherein the electroacoustic converter has a thermal expansion coefficient of 12 ppm/° C. to 100 ppm/° C.,
wherein the electroacoustic conversion film has a hygric expansion coefficient in a range of 1 to 30 ppm/% RH at 25° C. and in a range of 3 to 40 ppm/% RH at 60° C.

12. The electroacoustic converter according to claim 11,
wherein an absolute value of a difference between a thermal expansion coefficient of the electroacoustic conversion film and a thermal expansion coefficient of the vibration plate is in a range of 0 ppm/° C. to 80 ppm/° C.

13. The electroacoustic converter according to claim 11,
wherein the electroacoustic conversion film has a thermal expansion coefficient of 12 ppm/° C. to 100 ppm/° C.

14. The electroacoustic converter according to claim 11,
wherein a loss tangent (Tan δ) of the electroacoustic conversion film at a frequency of 1 Hz and 60° C. according to dynamic viscoelasticity measurement is 0.03 or greater.

15. The electroacoustic converter according to claim 11,
wherein the electroacoustic conversion film includes a protective layer laminated on a surface of the electrode layer on a side opposite to a surface provided with the polymer-based piezoelectric composite material.

16. The electroacoustic converter according to claim 12,
wherein the electroacoustic conversion film has a thermal expansion coefficient of 12 ppm/° C. to 100 ppm/° C.

17. The electroacoustic converter according to claim 12,
wherein a loss tangent (Tan δ) of the electroacoustic conversion film at a frequency of 1 Hz and 60° C. according to dynamic viscoelasticity measurement is 0.03 or greater.

18. The electroacoustic converter according to claim 12,
wherein the electroacoustic conversion film includes a protective layer laminated on a surface of the electrode layer on a side opposite to a surface provided with the polymer-based piezoelectric composite material.

19. The electroacoustic converter according to claim 13,
wherein a loss tangent (Tan δ) of the electroacoustic conversion film at a frequency of 1 Hz and 60° C. according to dynamic viscoelasticity measurement is 0.03 or greater.

20. The electroacoustic converter according to claim 13,
wherein the electroacoustic conversion film includes a protective layer laminated on a surface of the electrode layer on a side opposite to a surface provided with the polymer-based piezoelectric composite material.

* * * * *